United States Patent
Yuda

(10) Patent No.: US 7,515,467 B2
(45) Date of Patent: Apr. 7, 2009

(54) METHOD OF PROGRAMMING A SEMICONDUCTOR NONVOLATILE MEMORY CELL AND MEMORY WITH MULTIPLE CHARGE TRAPS

(75) Inventor: Takashi Yuda, Kunagawa (JP)

(73) Assignee: Oki Semiconductor Co., Ltd. (JP)

( * ) Notice: Subject to any disclaimer, the term of this patent is extended or adjusted under 35 U.S.C. 154(b) by 23 days.

(21) Appl. No.: 11/898,302

(22) Filed: Sep. 11, 2007

(65) Prior Publication Data

US 2008/0080238 A1    Apr. 3, 2008

(51) Int. Cl.
    *G11C 11/34*    (2006.01)
(52) U.S. Cl. .............................. 365/185.03; 365/185.24
(58) Field of Classification Search ............ 365/185.03, 365/185.24
    See application file for complete search history.

(56) References Cited

U.S. PATENT DOCUMENTS

| 5,768,191 | A  | * | 6/1998 | Choi et al. | 365/185.22 |
| 6,452,840 | B1 | * | 9/2002 | Sunkavalli et al. | 365/185.3 |
| 6,934,194 | B2 | * | 8/2005 | Takahashi et al. | 365/185.29 |
| 6,950,347 | B2 | * | 9/2005 | Kurata et al. | 365/185.28 |
| 6,950,349 | B2 | * | 9/2005 | Nakayama | 365/189.07 |
| 7,079,421 | B2 | * | 7/2006 | Yaoi et al. | 365/185.24 |
| 7,388,252 | B2 | * | 6/2008 | Lung | 257/315 |

FOREIGN PATENT DOCUMENTS

| JP | 10-027486 | 1/1998 |
| JP | 2005-064295 | 3/2005 |

OTHER PUBLICATIONS

Eitan et al., "4-bit per Cell NROM Reliability", IEEE International Electron Devices Meeting 2005: iedm Technical Digest: Washington, DC: Dec. 5-7, 2005, The United States, IEEE, 2005, Session 22.1.

\* cited by examiner

*Primary Examiner*—Michael T Tran
(74) *Attorney, Agent, or Firm*—Studebaker & Brackett PC; Donald R. Studebaker

(57) ABSTRACT

A semiconductor nonvolatile memory has a memory cell array in which each memory cell has a pair of charge traps and each charge trap stores data with at least three possible values. Different data values produce different read current values. To store data, a controller and a voltage supplying unit in the semiconductor nonvolatile memory successively program and verify the charge traps that require programming, using higher programming voltages for data values that must produce lower read currents. This operation is iterated on the charge traps that have not yet attained their necessary read current values, until no such charge traps remain. The programming voltages are set so that all charge traps require substantially the same number of programming iterations, regardless of the data being stored.

19 Claims, 16 Drawing Sheets

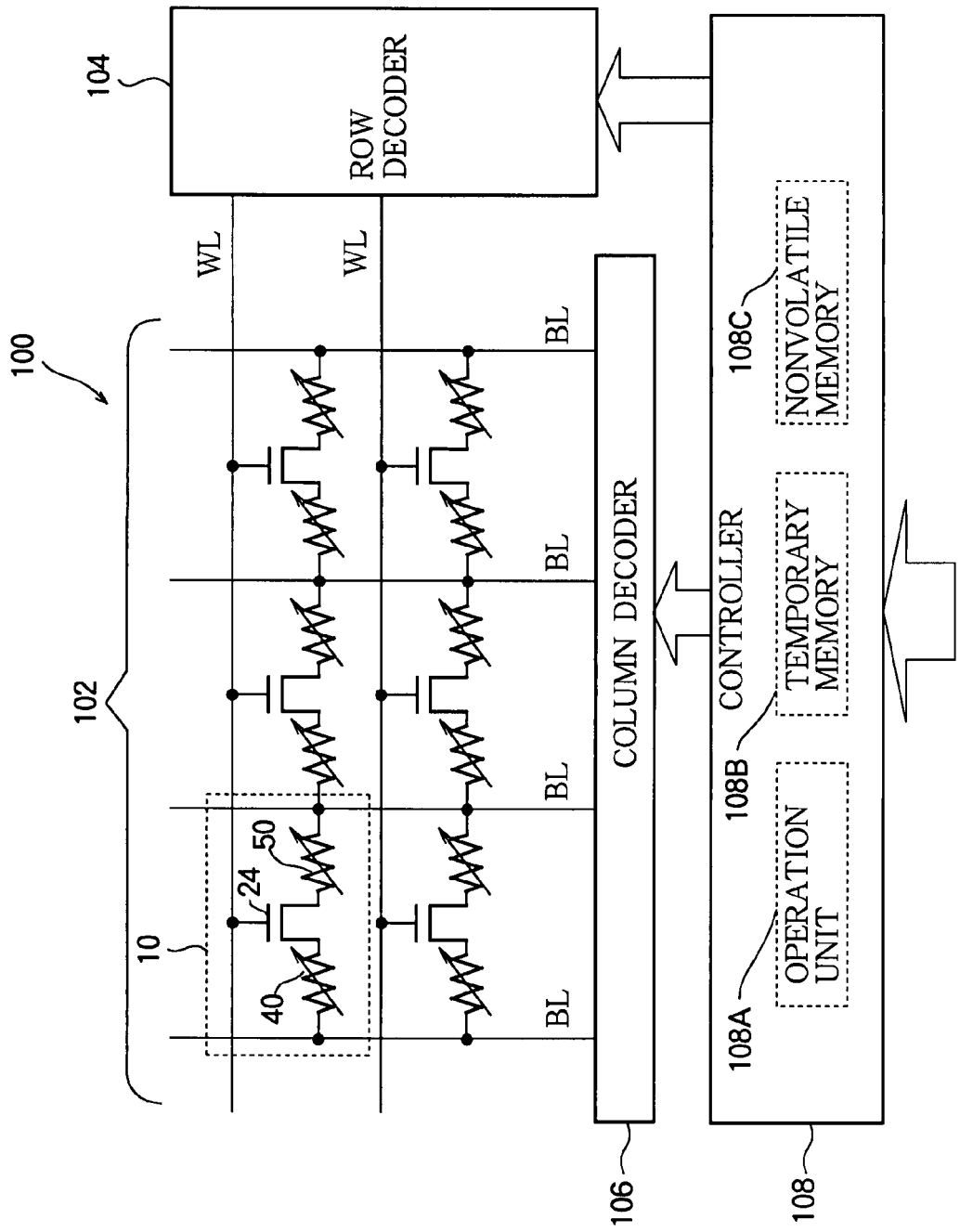

the same current value in all memory cells, and likewise '1' should be represented by the same current value in all memory cells. In practice, however, process variations and other factors produce cell-to-cell differences in the current values.

METHOD OF PROGRAMMING A SEMICONDUCTOR NONVOLATILE MEMORY CELL AND MEMORY WITH MULTIPLE CHARGE TRAPS

BACKGROUND OF THE INVENTION

1. Field of the Invention

The present invention relates to a semiconductor nonvolatile memory having memory cells with multiple charge traps, more particularly to a method of programming data into the memory cells.

2. Description of the Related Art

A known type of semiconductor nonvolatile memory has memory cells with two charge traps, each of which can store bi-level data ('0' or '1'), enabling the memory cell to store two bits of data. One such semiconductor nonvolatile memory, described in Japanese Patent Application Publication (JP) No. 2005-64295, places two physically discontinuous charge traps comprising silicon nitride films on the source and drain sides of the gate electrode of each memory cell. FIG. 1 conceptually illustrates four memory cells in this type of memory. The silicon nitride films are indicated by hatching. The initial state of a charge trap, with no trapped charge, represents '1'. The programmed state, with electrons trapped in the silicon nitride film, represents '0'.

A semiconductor nonvolatile memory with this structure is programmed, read, and erased as follows.

To program a charge trap that is in the initial '1' state and thereby write a '0' into the charge trap, if the charge trap is located on the drain side of the memory cell, positive voltages are applied to the drain and gate electrodes of the memory cell and the source electrode is held at the ground potential. Hot electrons are thereby injected into the charge trap, and the stored data value changes to '0'.

To read the information stored on the drain side of the memory cell, positive voltages are applied to its source and gate electrodes and the drain electrode is held at the ground potential. The memory cell then conducts current, but if the drain charge trap has been programmed to the '0' state, the current flow is considerably reduced as compared with the initial '1' state. A relatively high current is accordingly read as a '1' and a relatively low current is read as a '0'.

To erase a charge trap that has been programmed to the '0' state by returning it to the initial '1' state, a positive voltage is applied to the adjacent source or drain electrode, a zero or negative voltage is applied to the gate electrode, and the opposite drain or source electrode is left open (floating). This generates hot holes in the drain region. The hot holes are injected into the charge trap, where they neutralize the trapped charge, erasing the stored information. Information can also be erased by heat treatment or exposure to ultraviolet light.

Since information is read by discriminating between high and low current values, ideally '0' should be represented by the same current value in all memory cells, and likewise '1' should be represented by the same current value in all memory cells. In practice, however, process variations and other factors produce cell-to-cell differences in the current values.

FIG. 2 schematically shows a histogram of the currents obtained by reading data from one side of a large number of memory cells when the other side (the mirror side) is in the initial state. The horizontal axis represents the read current value, and the vertical axis represents the number of charge traps producing that current value. The actual current values representing '0' and '1' are distributed around the ideal values. The space between the '0' and '1' current value distributions is referred to as the current window. To read '0' and '1' data correctly, an adequately wide current window is essential.

Work is now proceeding toward enabling this type of memory to store four bits of data per memory cell by distinguishing among four current levels (representing '00', '01', '10', and '11'), so that two bits can be stored in each charge trap. One such memory, in which the silicon nitride layer film is formed as a continuous film below the gate electrode, was described by Eitan et al. at the International Electron Devices Meeting (IEDM) of the Institute of Electrical and Electronics Engineers (IEEE) in Washington, D.C. in 2005.

In this four-bit-per-cell memory, a two-phase programming method is used. To prevent cross talk between the two charge traps in a memory cell, both phases are carried out in a series of steps in which the two charge traps are programmed alternately and the programming voltage is gradually raised. Following each step, the programming result is verified by testing the threshold voltage of the memory cell. The first phase is a high-speed phase in which the drain voltage is raised (drain stepping). In the procedure shown in FIG. 4 of a paper published by Eitan et al. in the 2005 IEDM Technical Digest, the initial drain voltage is three volts (3 V) and drain stepping halts when a desired threshold voltage is attained. The second phase is a high-accuracy phase in which the gate voltage is raised (gate stepping). In FIG. 4 of the above paper, gate stepping begins at 7 V and halts when another desired threshold voltage is attained.

Proceeding in this way in a series of program-verify steps enables the desired amount of charge to be injected into the charge trap more accurately than would be possible by injecting the charge in a single step.

In connection with a semiconductor nonvolatile memory such as a flash memory of the floating-gate type that stores multiple bits per memory cell by storing different amounts of charge in the floating gate, JP 10-27486 describes a program-verify procedure that proceeds in order from the memory cells requiring the most programming to those that require the least programming. The purpose of this strategy is to avoid the 'word-line disturb' problem, in which the application of high negative voltages to a word line to program selected memory cells on the word line also slightly programs non-selected memory cells on the same word line, disturbing the data stored in the non-selected cells.

The cross-talk problem that occurs in memory cells with two charge traps is similar: programming the charge trap on one side of the cell may reduce the read current value of the charge trap on the mirror side. For example, if memory cells of the type described in JP 2005-64295 are used to store two bits of information as shown in FIG. 1, and if the charge trap on the source side is programmed to the '0' state while the charge trap on the drain side is left in the '1' state, an unwanted reduction in the read current of the charge trap on the drain side may occur. The main reason is that the charge stored in the source-side charge trap somewhat impedes the flow of current through the memory cell when the drain-side charge trap is read.

FIG. 3 schematically illustrates this problem. The horizontal axis indicates the read current value and the vertical axis indicates histogram frequency as in FIG. 2. The solid curves indicate the histograms of bits programmed to '0' and '1' in a large number of memory cells in which the mirror bit is in the '1' state. The dotted curve indicates the position to which the '1' histogram is shifted by programming the mirror bit to '0'. Although the '0' and '1' data are still distinguishable, the current window is considerably narrowed. An accurate program-verify procedure can overcome this problem by reducing the spread of the read current values in the '1' and '1' histograms, thereby assuring that a reasonable current window is maintained.

A similar problem also occurs if the memory cell is used to store more than two bits of information. Suppose, for example, that the semiconductor nonvolatile memory described in JP 2005-64295 is adapted to store four bits per cell as shown in FIG. 4, by programming four levels of charge, representing '00', '01', '10', and '11', into the charge traps. FIG. 5 schematically shows histograms of the read currents obtained from a large number of memory cells in this type of semiconductor nonvolatile memory; the horizontal axis represents current values and the vertical axis represents histogram frequencies of the read current values for charge traps storing '00', '01', '10', and '11' data when the mirror charge trap is in the initial ('11') state. The current windows are smaller than when only two bits are stored per memory cell. The dotted lines in FIG. 6 indicate the shifts in these histogram curves caused by programming the charge trap on the mirror side of each memory cell to '00'. The current windows are now inadequate for reliable reading. In particular, there is now substantially no current window between the '11' distribution when the mirror charge trap is programmed to '00' (the rightmost dotted curve) and the '10' distribution when the mirror charge trap is left in the non-programmed state (the second solid curve from the right).

The strategy proposed in the IEDM paper cited above attempts to overcome this problem by simultaneous (that is, alternate) programming of both sides of the memory cell. When the same data value is programmed into both sides of the memory cell, for example, if the two sides are programmed alternately in a series of steps, the programming procedure can be stopped when both sides have attained substantially the intended read current level.

A problem with this strategy is that when different data values are programmed into the two sides of the memory cell, one side may attain its intended read current before the mirror side does so. Consequently, the number of programming repetitions on the two sides of the memory differs, and programming of one side of the memory cell must continue after programming of the mirror side ends. The continued programming on the one side of the memory cell then affects the read current value on the mirror side. This problem is hard to avoid, especially if the initial programming voltage is the same on both sides of the memory cell, as in the two-phase programming procedure described in the IEDM paper cited above.

SUMMARY OF THE INVENTION

An object of the present invention is to maintain adequate current windows when storing data in nonvolatile memory cells having multiple charge traps that store data with at least three possible values per charge trap.

The invention provides a method of storing data in such a memory cell by repeatedly programming and verifying its charge traps. In each programming operation, a programming voltage is applied to inject charge into a charge trap, thereby reducing the read current obtained when the data stored in the charge trap are read. Programming is iterated until the read current is reduced to the desired level.

To store a first data value in one charge trap in the memory cell and store and a second data value in another charge trap in the memory cell, if the first data value is read as a lower current value than the second data value, the invented method uses a higher programming voltage for the first data value than for the second data value. Both charge traps are programmed by applying these programming voltages and both charge traps are verified by reading the stored data. This operation is repeated until one of the resulting read current values has been reduced to the necessary level. If the other read current value has also reached its necessary level, the storing operation is finished. Otherwise, programming of the charge trap that is still producing too much read current continues until the necessary read current level is obtained.

The two programming voltages are preferably selected so that the programming of both charge traps is completed in substantially the same number of programming iterations. As a result, once the programming of one charge trap is completed, its read current will not be significantly lowered by lengthy further programming of the other charge trap. Both charge traps can accordingly be brought to the desired read current levels and an adequate current window between these current levels can be maintained.

When the invented method is applied to a semiconductor nonvolatile memory having an array of memory cells of the above type, the first and second data values are programmed in the same way, except that each programming iteration includes programming of all the relevant memory cells.

This programming method may be applied to all data values that require programming, higher programming voltages being used for data values represented by lower read current values.

Alternatively, the programming of data may be carried out in two steps. In the first step, the data value with the lowest read current value is programmed into all charge traps that are to store this data value. In the second step, the remaining data values are stored, using higher programming voltages for data values that have lower read current values. This two-step procedure has the advantage that none of the data values stored in the second step are affected by the programming in the first step. Although the read currents attained in the first step may be further lowered by cross talk during the second step, this lowering does not narrow any current windows.

The invention also provides a semiconductor nonvolatile memory comprising an array of memory cells of the above type, a voltage supplying unit that supplies programming voltages, and a controller that controls the voltage supplying unit so as to store data by the invented method.

The invention also provides a method of manufacturing a semiconductor nonvolatile memory that includes writing data by the invented method.

BRIEF DESCRIPTION OF THE DRAWINGS

In the attached drawings:

FIG. 9 schematically illustrates the structure of a semiconductor nonvolatile memory embodying the invention;

DETAILED DESCRIPTION OF THE INVENTION

Figure 1:
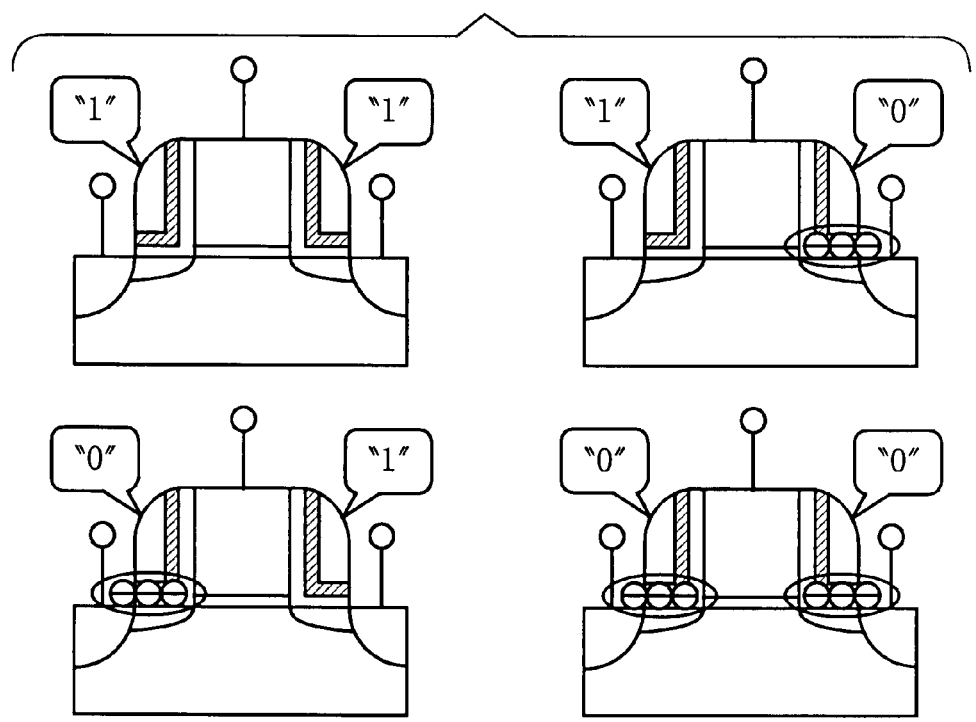
FIG. 1 schematically illustrates four memory cells storing different combinations of data in a first conventional semiconductor nonvolatile memory.
Figure 2:
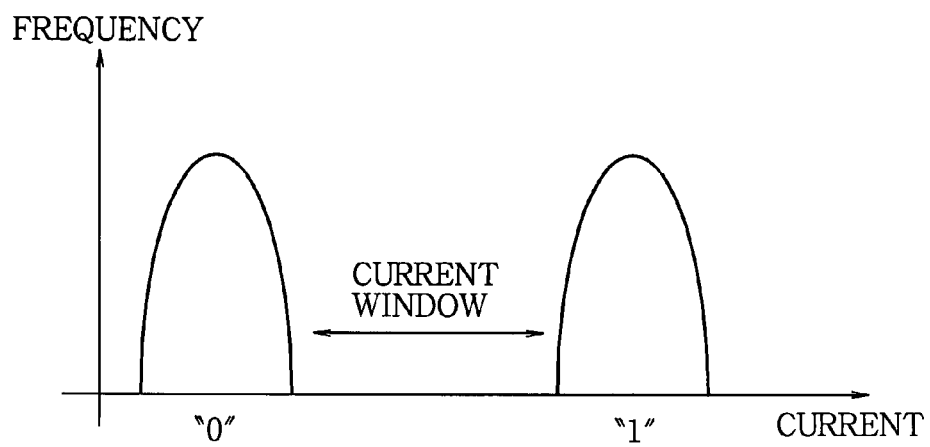
FIG. 2 is a histogram illustrating the current window between '1' and '1' data when only one side of each memory cell in the first conventional semiconductor nonvolatile memory is programmed.
Figure 3:
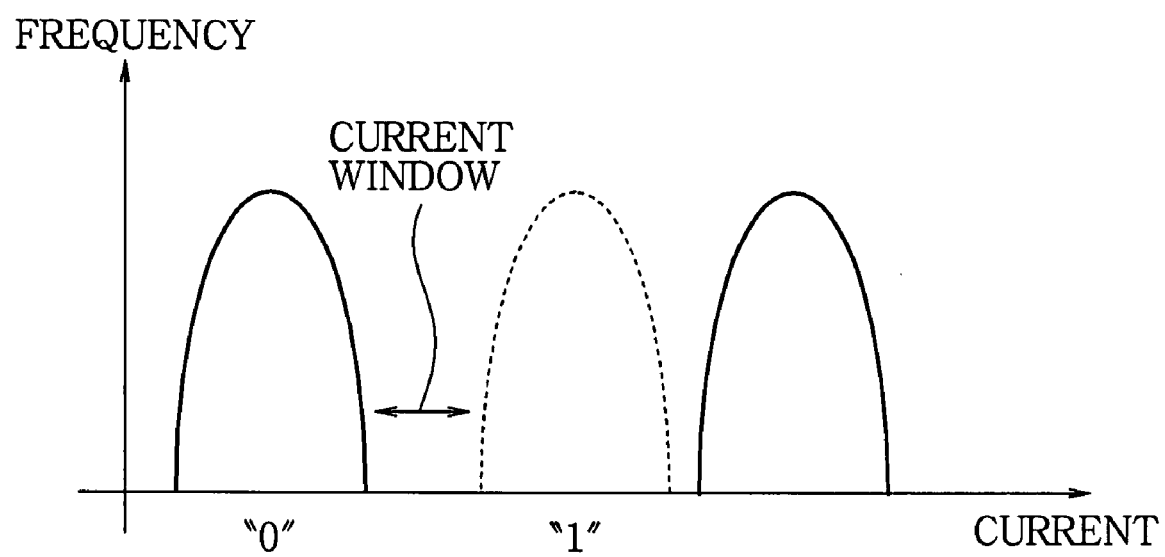
FIG. 3 is a histogram illustrating the reduction of read current on one side of a memory cell due to programming of the mirror side in the first conventional semiconductor nonvolatile memory.
Figure 4:
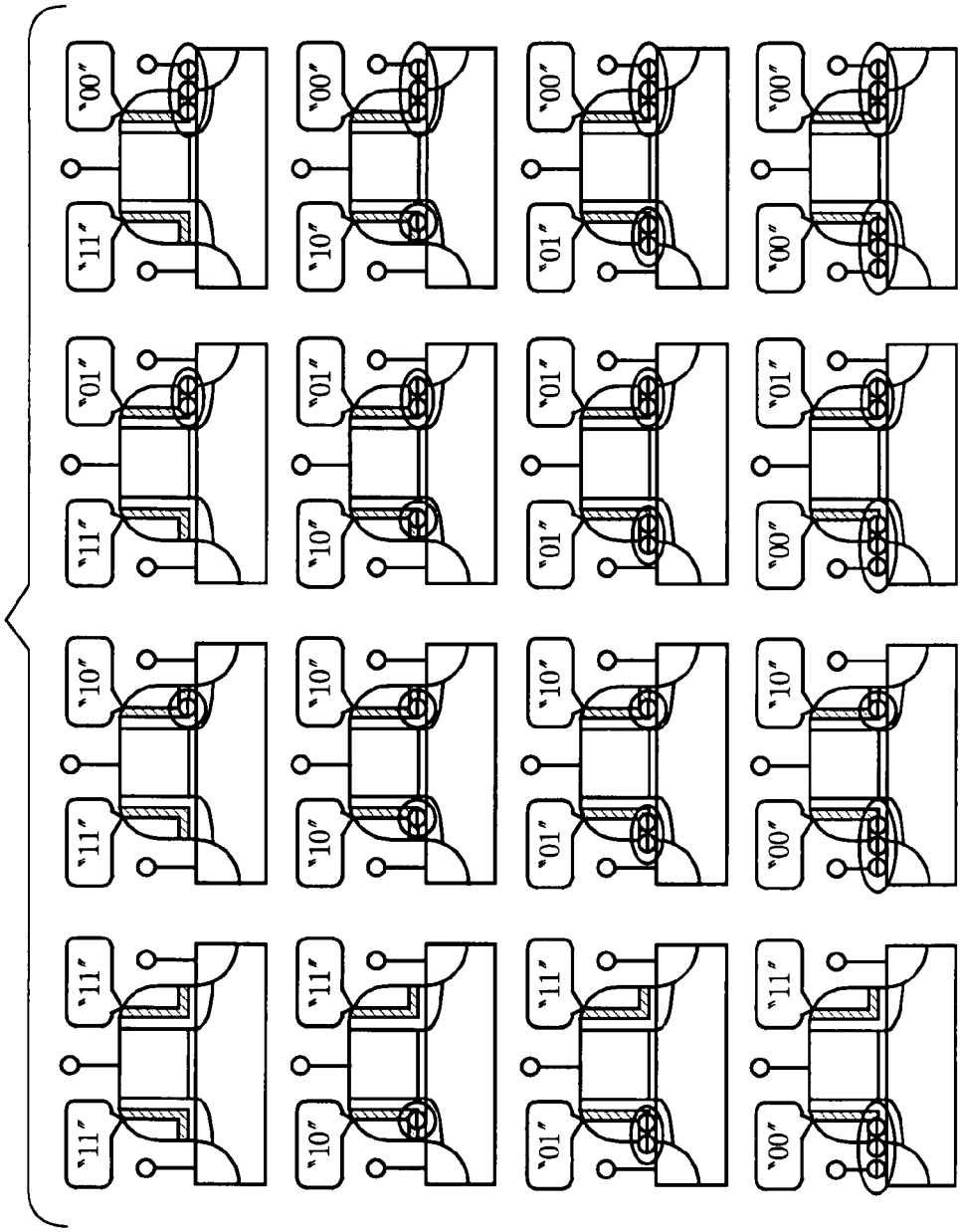
FIG. 4 schematically illustrates sixteen memory cells storing different combinations of data in another conventional semiconductor nonvolatile memory.
Figure 5:
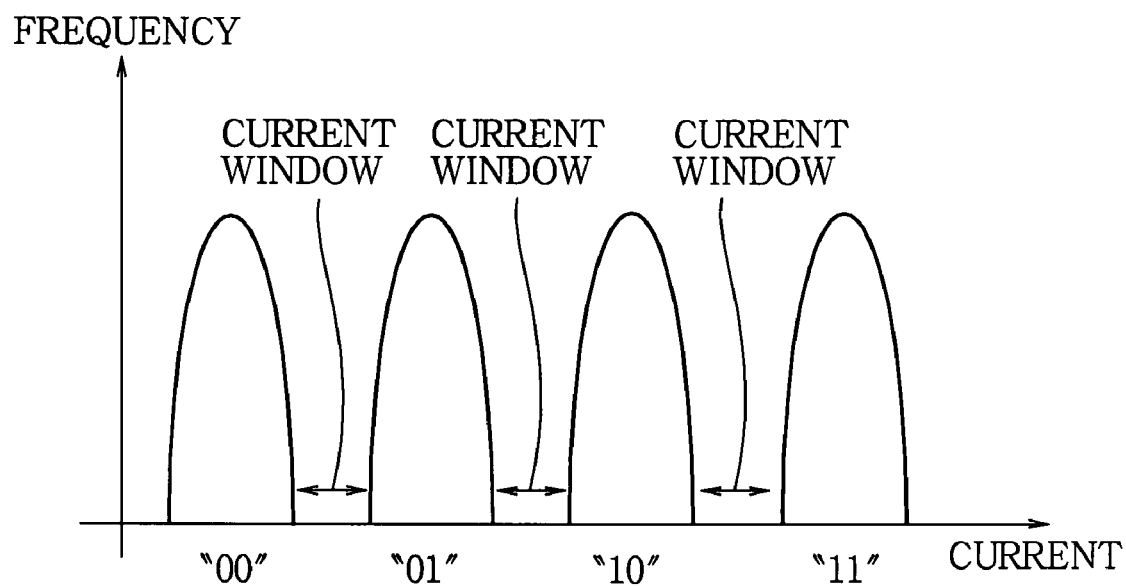
FIG. 5 is a histogram illustrating the current windows when only one side of each memory cell is programmed in the in the semiconductor nonvolatile memory in FIG. 4.
Figure 6:
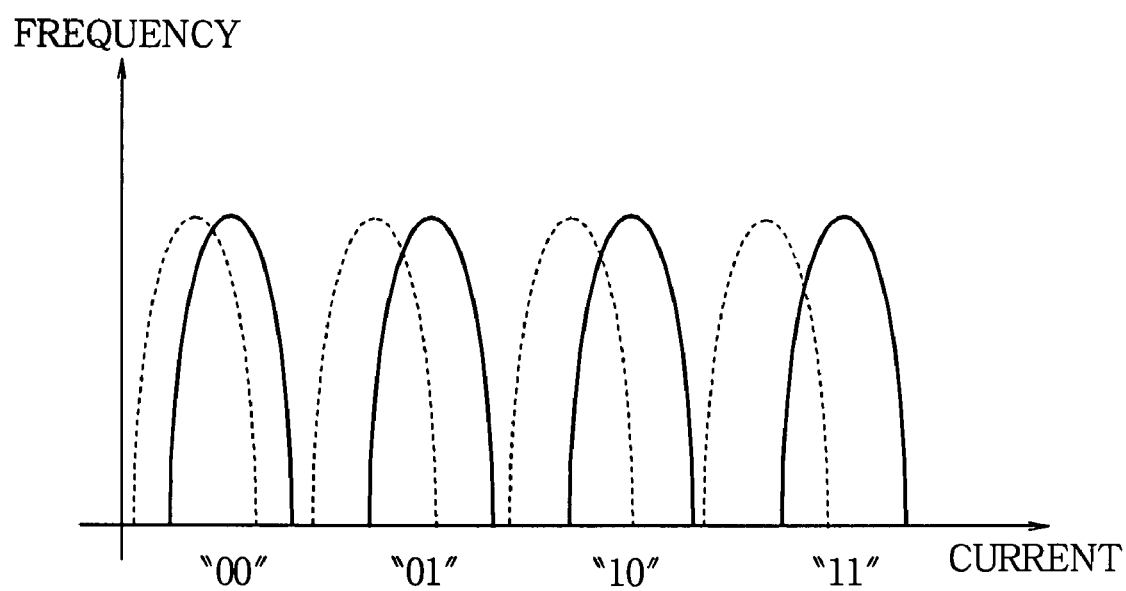
FIG. 6 is a histogram illustrating the reduction of read current on one side of a memory cell due to programming of the mirror side in the conventional semiconductor nonvolatile memory in FIG. 4.

Embodiments of the invention will now be described with reference to the attached drawings, in which like elements are indicated by like reference characters. The drawings have been drafted so as to illustrate the invention clearly, but they do not necessarily show actual dimensions, shapes, sizes, or positional relationships, and are not intended to limit the scope of the invention.

For example, although the embodiments deal with memory cells with charge traps that store data with four possible values ('00', '01', '10', '11'), the invention is applicable to memory cells with charge traps storing data with any number of possible values equal to or greater than three.

First Embodiment

The first embodiment will be described with reference to FIGS. 7, 8, 9, 10A, 10B, 11, 12A, 12B and 13, which depict a semiconductor nonvolatile memory and a method of writing data into the semiconductor nonvolatile memory. This method may be embodied in a program executed by the controller in the semiconductor nonvolatile memory, and may also be used in the manufacture of a semiconductor nonvolatile memory to write prestored data or test data.

Figure 7:
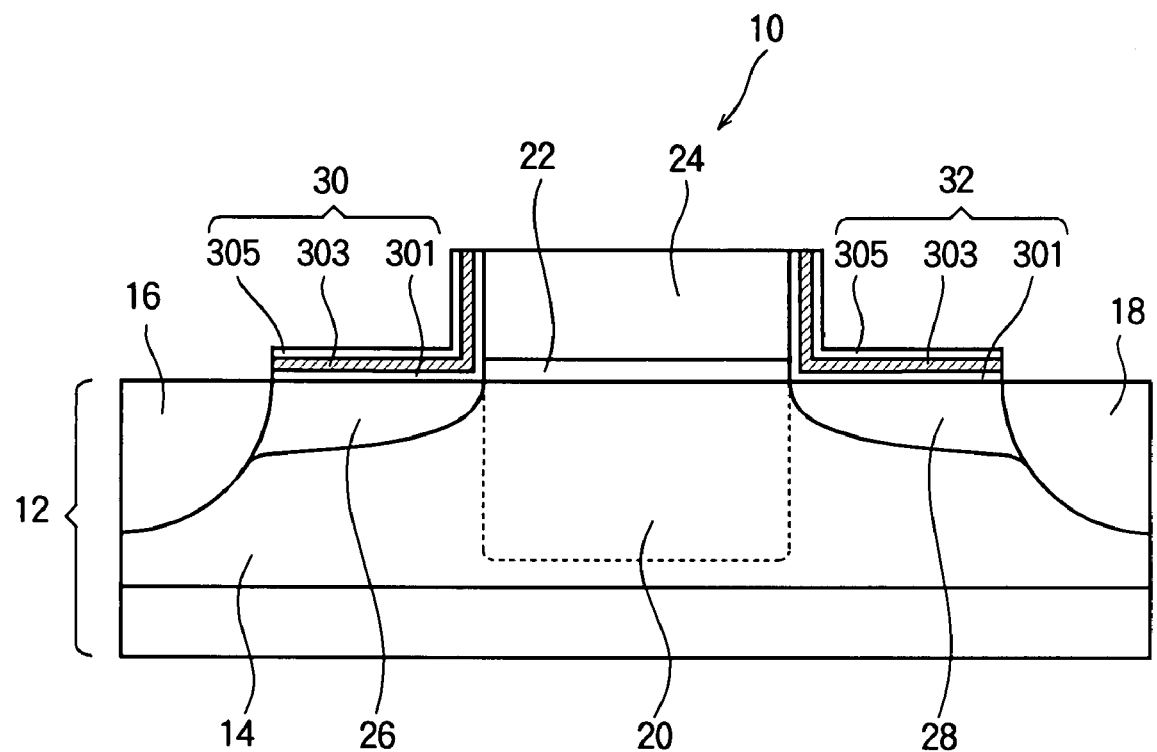
FIG. 7 is a sectional view of a memory cell in a semiconductor nonvolatile memory embodying the present invention.

FIG. 7 is a sectional view of an n-channel metal-oxide-semiconductor field-effect transistor (nMOSFET) that functions as a memory cell 10 in a semiconductor nonvolatile memory according to the first embodiment.

The memory cell 10 is formed in the surface of a p-type semiconductor silicon substrate 12. The memory cell 10 is disposed in a p-type area 14 referred to as a p-well. An $n^+$-type source area 16 and drain area 18, both including a high concentration of an n-type impurity, are formed in the surface of the p-well area 14, mutually separated by a certain distance. The source area 16 and drain area 18 are connected by metal contacts (not shown) to a metal wiring layer (not shown); the metal contacts and their connected metal wiring form a source electrode and a drain electrode. In the following description the source area 16, drain area 18, and their electrodes will sometimes be referred to simply as the source and drain of the memory cell 10.

The part of the p-well area 14 disposed between the source area 16 and drain area 18 is a channel formation area 20 in which a channel carrying current between the source area 16 and drain area 18 may form during the operation of the memory cell 10. The channel formation area 20 is covered by a first insulating film or gate insulation film 22. A gate electrode 24 formed on the gate insulation film 22 functions as the control electrode of the memory cell 10. The channel formation area 20 is a silicon oxide ($SiO_2$) film, and the gate electrode 24 is made of polycrystalline silicon (polysilicon). This nMOSFET structure is well known, so an extensive description will be omitted.

In this embodiment, a first variable-resistance area 26 is disposed between the source area 16 and channel formation area 20, in contact with the source area 16, and a second variable-resistance area 28 is disposed between the drain area 18 and channel formation area 20, in contact with the drain area 18.

The first variable-resistance area 26 and second variable-resistance area 28 are n-type impurity regions with concentrations lower than the concentrations in the source area 16 and drain area 18. This structure, described in more detail later, makes it possible to concentrate the electric field around the first and second variable-resistance areas 26, 28 in order to inject charge into the charge traps described below. As a result, hot carriers are generated around the first and second variable-resistance areas 26, 28. The impurity concentration and size (width and depth) of the first and second variable-resistance areas 26, 28 are design choices. The structure of the first and second variable-resistance areas 26, 28 is generally similar to the so-called lightly doped drain (LDD) structure.

A first charge trap 30 is provided on the first variable-resistance area 26 and a second charge trap 32 is provided on the second variable-resistance area 28 in this embodiment. The first and second charge traps 30, 32 are layered dielectric films with an oxide-nitride-oxide (ONO) structure: a silicon oxide film 301, a silicon nitride film 303, and a silicon oxide film 305 are formed in successive layers from the bottom up on the first variable-resistance area 26 and second variable-resistance area 28; this structure provides a stable charge trap function.

The hot carriers injected from the first and second variable-resistance areas 26, 28 are stored mainly in the silicon nitride film 303 of these ONO layered dielectric films. Other charge trap structures are applicable, according to the purpose and design of the memory. For example, one or more types of dielectric films selected from a silicon nitride film, an aluminum oxide ($Al_2O_3$) film, and a hafnium oxide ($HfO_x$) film may be disposed between the first and second oxide films, which may still be silicon oxide films.

In the illustrated exemplary structure, the first charge trap 30 and second charge trap 32 extend from above the first and second variable-resistance areas 26, 28 onto the side walls of the gate electrode 24, ensuring the storage and retention of the injected charge.

The locations of the first variable-resistance area 26, second variable-resistance area 28, the first and second charge traps 30, 32, adjacent the source area 16 and drain area 18, respectively, enable separate programming of the charge traps 30 and 32.

The physically discontinuous first charge trap 30 and second charge trap 32 are formed exterior to the two sides of the gate electrode 24, enabling separate storage of charge in the first and second charge traps 30, 32 even if the gate length is reduced.

Figure 8:
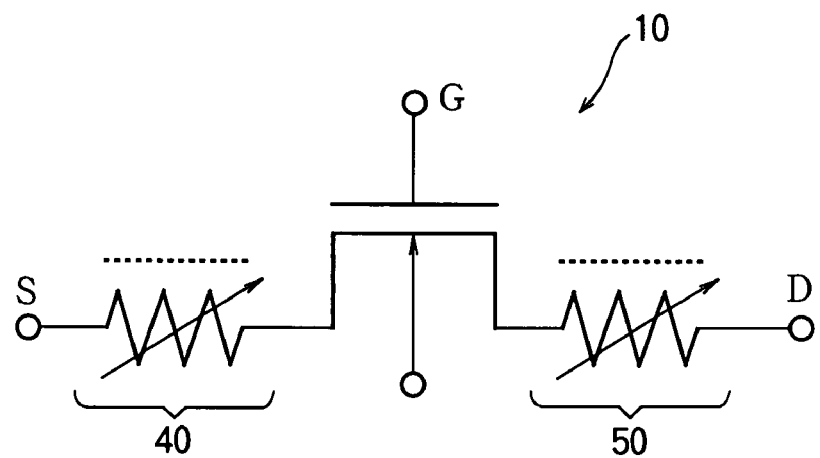
FIG. 8 is an equivalent circuit diagram of the memory cell in FIG. 7.

FIG. 8 is an equivalent circuit diagram of the memory cell described above. As shown in FIG. 8, the memory cell is equivalent to a circuit in which a first variable resistor 40 and second variable resistor 50 are connected to the source (S) and drain (D) electrodes of the nMOSFET constituting the memory cell 10.

Next, the programming, reading, and erasing of data in the memory cell 10 will be described with reference to Table 1. In the following description, as an example, data are written, read, and erased in the drain area 18 of the memory cell 10. It will be appreciated that data can be written, read, and erased from the source side of the memory cell 16 in the same way, by interchanging the source and drain voltages.

TABLE 1

|         | Drain     | Gate       | Source |
|---------|-----------|------------|--------|
| Program | +Vdw      | +Vgw       | 0      |
| Read    | 0 or +Vdr | +Vgr       | +Vsr   |
| Erase   | +Vde      | 0 or −Vge  | +Vse   |

Data are written into the memory cell 10, for example, as follows. In this example, the initial state is defined as the state where the charge traps have no stored charge (corresponding to logic value '11'). From the initial state, one of logic values '00', '01' and '10', that is, a logic value other than '11', is written in the second charge trap 32. To program this charge trap 32, a positive voltage (+Vdw) is applied to the drain area 18, a positive voltage (+Vgw) is applied to the gate electrode 24, and the source area 16 is held at the ground potential (0V).

In this condition, an electric field is concentrated around the second variable-resistance area 28, which has a lower n-type impurity concentration than the drain area 18. Generation of hot electrons (also referred to as high-energy electrons) by impact ionization is thus effectively concentrated around the second variable-resistance area 28.

The hot electrons generated in the second variable-resistance area 28 overcome the energy barrier of the silicon oxide film 301 and are selectively injected into the second charge trap 32 to program the desired data.

The drain voltage +Vdw must be sufficient to generate hot electrons. The +Vdw value is a design choice, but should be at least about 2 V, and preferably in the range from about 5 V to about 10 V.

The gate voltage +Vgw should be sufficient to generate an adequate supply of carriers in the channel area 20 and to draw hot electrons generated near the drain area 18 into the second charge trap 32. The +Vgw value is also a design choice, but a value in the range from about 3 V to about 12 V is preferred.

It is also necessary to use higher voltages for writing data with smaller logic values, that is, smaller read current values, as described in further detail below.

Next, the data are read out from the drain area 18 as follows. To read data from the drain side, a positive voltage (+Vsr) is applied to the source area 16, a positive voltage (+Vgr) is applied to the gate electrode 24, and a zero or positive voltage (+Vdr) is applied to the drain area 18.

On the drain side, if charge (electrons) is stored in the second charge trap 32, the resistance of the second variable-resistance area 28 rises as the amount of stored charge increases. As a result, the number of carriers reaching the channel area 20 the from drain area 18 is reduced, reducing the flow of current through memory cell 10.

If the drain side has not been programmed and is in the initial '11' state, with no charge stored in the second charge trap 32, the resistance of the second variable-resistance area 28 is comparatively low, producing the full normal flow of current through the memory cell 10.

That is, the logic value '00', '01', '10' and '11' stored on the drain side can be discriminated by the difference in current flow (the read current value).

Programmed data can be erased (a) optically or thermally, or (b) electrically, as follows.

(a) When the memory cell 10 is used in a one time programmable read only memory (OTPROM) device, for example, writing is in principle performed only once. However, data written during tests performed at the fabrication site to eliminate defective products must be erased. For this purpose, the data stored in all charge traps in all memory cells 10 can be erased at once by exposing the memory cells to ultra-violet light or heat at a designated intensity for a designated time. This erasing method can reduce the cost of the memory device because no separate erasing circuitry is necessary.

(b) The memory device can also be configured to allow electrical erasing of data in individual memory cells, as in an electrically erasable and programmable read only memory (EEPROM). If the second charge trap 32 has been programmed to one of the logic values '00', '01', and '10' and stores charge, the stored charge can be removed by applying a positive voltage (+Vde) to the drain area 18, a zero or negative voltage (−Vge) to the gate electrode 24, and a positive voltage (+Vse) to the source area 16. The drain voltage +Vde must be sufficient to generate hot holes around the drain area 18; +Vde should be at least about 2 V, and is preferably between about 4 V and about 10 V. The gate voltage −Vge should be sufficient to collect hot holes efficiently around the second charge trap 32; −Vge is preferably between about −7 V and 0 V. Under these conditions, the hot holes generated around the drain area 18 are injected into the second charge trap 32. The charge (electrons in this case) stored in the second charge trap 32 is thereby neutralized, and the data are erased.

Next, the structure of a semiconductor nonvolatile memory 100 according to the first embodiment will be described with reference to FIG. 9.

The semiconductor nonvolatile memory 100 in FIG. 9 has a memory cell array 102 comprising a plurality of memory cells 10. The memory cell array 102 has a plurality of word lines WL extending in a first direction (the row direction) and a plurality of bit lines BL extending in a second direction (the column direction) orthogonal to the first direction. A memory cell 10 is located at each intersection of a line WL and a bit line BL.

The gate electrode 24 of the memory cell 10 is connected to a word line WL. The source area 16 and drain area 18 of the memory cell 10 are connected to respective bit lines BL.

The word lines WL are connected to a row decoder 104; the bit lines BL are connected to a column decoder 106. The row decoder 104 and column decoder 106, which function as a voltage supplying unit, are both connected to a controller 108.

The controller 108 comprises an operation unit 108A that controls reading and writing of data in the memory cell array 102, a temporary memory 108B that temporarily stores data, and a nonvolatile memory 108C that stores various programs, including a data writing program that will be described below. When supplied from an external source with data, the controller 108 first executes the data writing program. For each two bits of data to be stored, the controller outputs the two bits, a row address indicating the row number of the memory cell 10 in which the two bits are to be stored, and command information indicating the voltage to be applied to the addressed word line WL to the row decoder 104, and outputs a column address indicating the column number of the memory cell 10 in which the two bits are to be stored and command information indicating the voltages to be applied to the two bit lines BL connected to the memory cell 10 to the column decoder 106.

The row decoder 104 controls the voltage applied to the word line WL according to the two bits of input data, the row address, and the command information. The column decoder 106 controls the voltages applied to the bit lines BL according to the input column address and the command information.

Next, the operation of the semiconductor nonvolatile memory 100 in the first embodiment will be described.

When supplied from an external source with data (four-bit data in the first embodiment) to be stored in one or more memory cells 10 in the memory cell array 102 and address information specifying the addresses of the memory cells 10 in which the data are to be stored, the controller 108 first places the data and address information in its temporary memory 108B, and then executes the data writing program stored in its nonvolatile memory 108C.

The data writing program programs and verifies each of the relevant charge traps 30, 32 in turn, flags incompletely programmed charge traps 30, 32, and then repeats this process on the incompletely programmed charge traps 30, 32, continuing until all read currents are equal to or less than predetermined values. The entire process will be described with reference to the flowchart in FIGS. 10A and 10B.

Figure 10A:
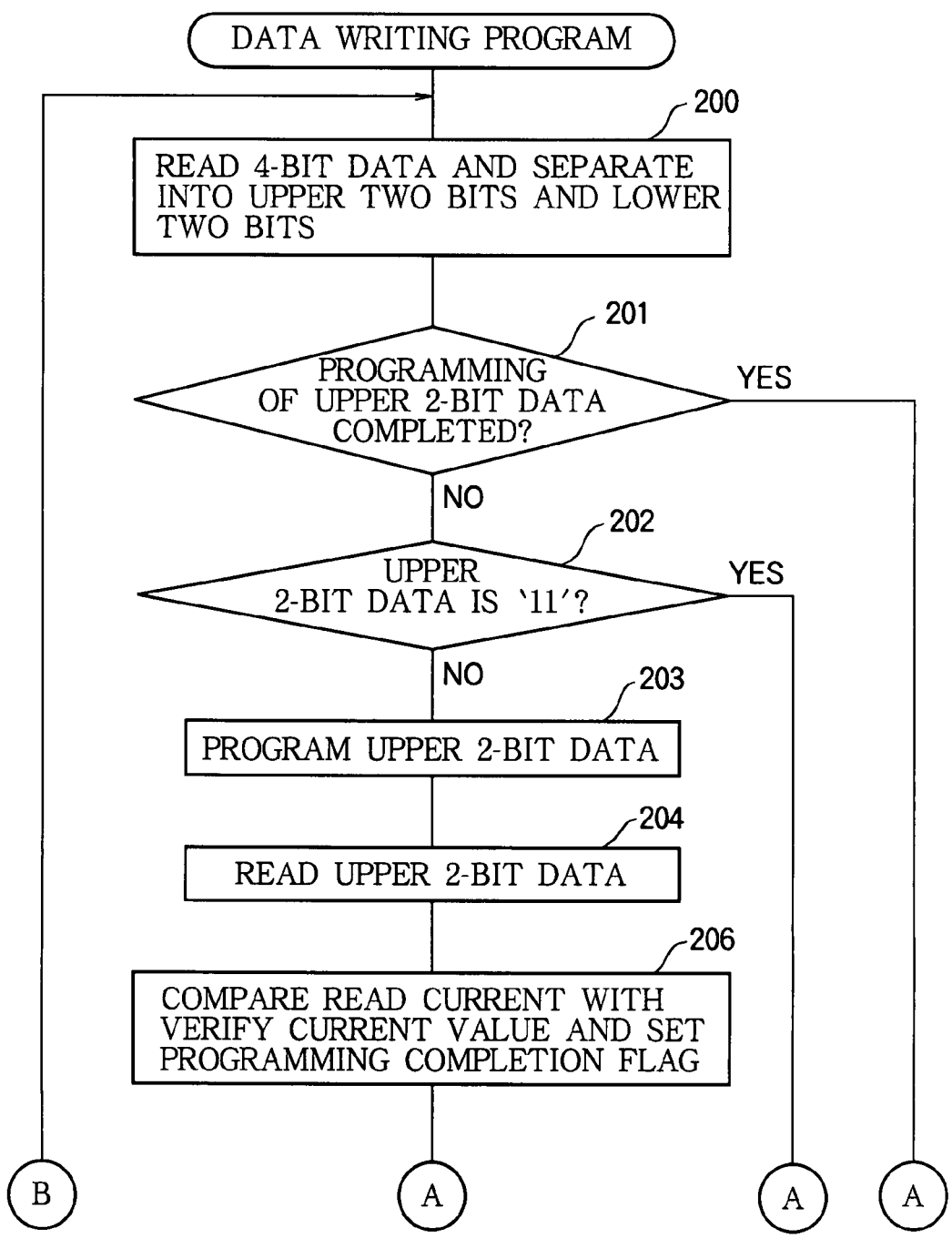
FIGS. 10A and 10B constitute a flowchart illustrating a program for writing data in a semiconductor nonvolatile memory according to a first embodiment of the invention.

Proceeding sequentially from the first address in the memory cell array 102, in step 200 in FIG. 10A the controller 108 reads the four-bit data to be stored in the addressed memory cell 10 from the temporary memory 108B and separates the four-bit data into an upper two bits and a lower two bits.

Figure 10B:
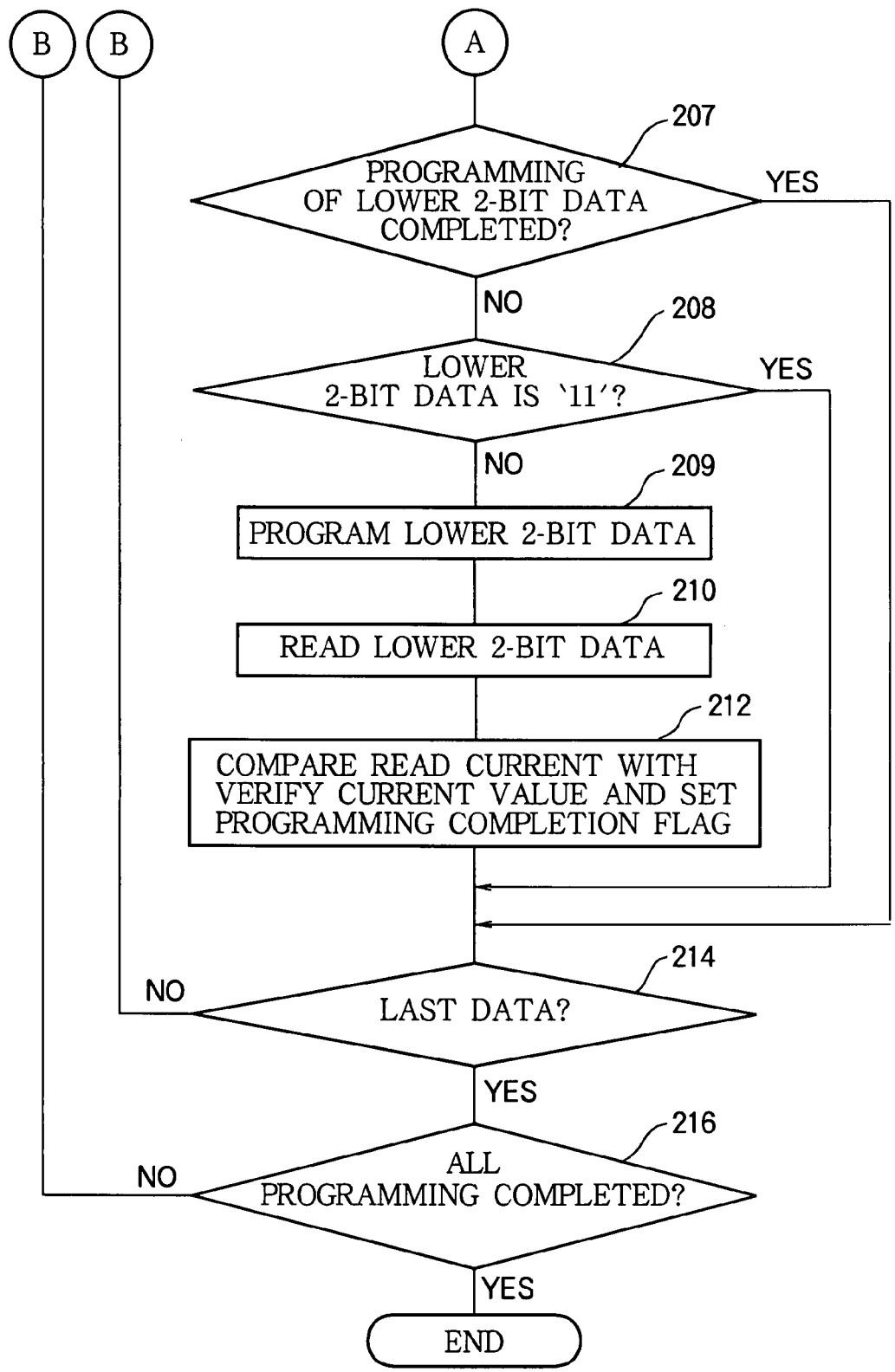

In step 201, the programming completion flag for the upper two-bit data are read from the temporary memory 108B to determine whether the writing of the upper two bits of data to be stored into the addressed memory cell 10 has already been completed. If the programming completion flag is set to '1', indicating incompletion, step 202 is executed next; if the programming completion flag is cleared to '0', indicating completion, step 207 in FIG. 10B is executed next.

The programming completion flag is initially set to '1', indicating incompletion. This is also true in the subsequent steps in this embodiment.

In step 202 in FIG. 10A, the upper two bits of data to be stored are tested to determine whether or not they are '11'. If the upper two bits are '11', no programming is necessary, so '0' is stored as the programming completion flag together with the address of these data in the temporary memory 108B, and step 207 in FIG. 10B is executed next. If the upper two bits of data are not '11' (if they are '00', '01', or '10'), step 203 in FIG. 10A is executed next.

In step 203, the upper two bits of data, a row address indicating the row number of the memory cell 10 in which these data are to be stored, and command information indicating the voltage to be applied to the word line WL are output to the row decoder 104, and a column address indicating the column number of the memory cell 10 in which the data are to be stored and command information indicating the voltage to be applied to the bit line BL connected to the source area 16 are output to the column decoder 106.

The row decoder 104 applies a positive voltage (+Vgw) corresponding to the upper two bits of data for a prescribed programming time to the word line WL with the row number specified by the row address. This positive voltage (+Vgw) will be described later.

The column decoder 106 grounds the bit line BL connected to the drain areas 18 with the column number specified by the column address, and applies a positive voltage (+Vdw) to the bit line BL connected to the corresponding source area 16.

A positive voltage (+Vdw) is thereby applied to the source area 16 of the specified memory cell 10, and a positive voltage (+Vgw) corresponding to the upper two data bits is applied to the gate electrode 24 of the specified memory cell 10, while the drain area 18 is held at the ground potential. A certain amount of charge is thereby stored in the first charge trap 30 of the memory cell 10.

In step 204, a row address indicating the row number of the memory cell 10 that was programmed in step 203 and command information indicating a voltage to be applied to the word line WL are output to the row decoder 104, and a column address indicating the column number of the memory cell 10 that was programmed in step 203 and command information indicating a positive or zero voltage to be applied to the word line BL connected to the source area 16 are output to the column decoder 106.

The row decoder 104 applies a positive voltage (+Vgr) to the word line WL with the row number specified by the row address.

The column decoder 106 applies a positive voltage (+Vsr) to the bit line BL connected to the drain areas 18 with the column number specified by the column address, and applies a positive (+Vdw) or zero voltage to the bit line BL connected to the source area 16.

A positive voltage (+Vdr) or the ground potential is thereby applied to the source area 16 of the specified memory cell 10, a positive voltage (+Vgr) is applied to the gate electrode 24 of the specified memory cell 10, and a positive voltage (+Vsr) is applied to the drain area 18 of the specified memory cell 10, causing current to flow between the drain area 18 and source area 16 of the memory cell 10.

In step 206, the value of this read current is compared with a predetermined read current value (also referred to below as the 'verify current value') corresponding to the data programmed in step 203. If the read current value is equal to or less than the verify current value, programming of the data into this charge trap is considered to be complete, and '0' is stored as the programming completion flag together with the address of these data in the temporary memory 108B. If the read current value is greater than the verify current value, programming of the data into this charge trap is considered to be incomplete, and '1' is stored as the programming completion flag together with the address of these data in the temporary memory 108B.

In step 207 in FIG. 10B, the programming completion flag for the lower two-bit data are read from the temporary memory 108B to determine whether the writing of the lower two bits of data to be stored into the addressed memory cell 10 has already been completed. If the programming completion flag is set to '1', indicating incompletion, step 208 is executed next; if the programming completion flag is cleared to '0', indicating completion, step 214 is executed next.

In step 208, the lower two bits of data to be stored are tested to determine whether or not they are '11'. If the lower two bits are '11', no programming is necessary, so '0' (indicating completion) is stored as the programming completion flag together with the address of these data in the temporary memory 108B, and step 214 is executed next. If the lower two bits of data are not '11' (if they are '00', '01', or '10'), step 209 is executed next.

In step 209, the lower two bits of data, a row address indicating the row number of the memory cell 10 in which these data are to be stored, and command information indicating the voltage to be applied to the word line WL are output to the row decoder 104, and a column address indicating the column number of the memory cell 10 in which the data are to be stored and command information indicating grounding of the bit line BL connected to the source area 16 are output to the column decoder 106.

The row decoder 104 applies a positive voltage (+Vgw) corresponding to the lower two bits of data for a prescribed programming time to the word line WL with the row number specified by the row address. This positive voltage (+Vgw) will be described later.

The column decoder 106 applies a positive voltage +Vgw for a prescribed programming time to the bit line BL connected to the drain areas 18 with the column number specified by the column address, and grounds the bit line BL connected to the source area 16.

A positive voltage (+Vdw) is thereby applied to the drain area 18 of the specified memory cell 10, and a positive voltage (+Vgw) corresponding to the lower two data bits is applied to the gate electrode 24 of the specified memory cell 10, while the source area 16 is placed at the ground potential. A certain amount of charge is thereby stored in the second charge trap 32 of the memory cell 10.

In step 210, a row address indicating the row number of the memory cell 10 that was programmed in step 209 and command information indicating a voltage to be applied to the word line WL are output to the row decoder 104, and a column address indicating the column number of the memory cell 10 that was programmed in step 209 and command information indicating a voltage to be applied to the bit line BL connected to the source area 16 are output to the column decoder 106.

The row decoder 104 applies a positive voltage (+Vgr) to the word line WL with the row number specified by the row address.

The column decoder 106 applies a positive (+Vdr) or zero voltage to the bit line BL connected to the drain areas 18 with the column number specified by the column address, and applies a positive voltage (+Vsr) to the bit line BL connected to the source area 16.

A positive voltage (+Vsr) is thereby applied to the source area 16, a positive voltage (+Vgr) is applied to the gate electrode 24, and a positive voltage (+Vdr) or ground voltage is applied to the drain area 18 of the specified memory cell 10, causing current to flow between the drain area 18 and source area 16 of the memory cell 10.

In step 212, the value of this read current is compared with a predetermined verify current value corresponding to the data programmed in step 209. If the read current value is equal to or less than the verify current value, programming of the data into this charge trap is considered to be complete, and '0' (indicating completion) is stored as the programming completion flag together with the address of these data in the temporary memory 108B. If the read current value is greater than the verify current value, programming of the data into this charge trap is considered to be incomplete, and '1' (indicating incompletion) is stored as the programming completion flag together with the address of these data in the temporary memory 108B.

In step 214, whether the data read in step 200 are the last data to be stored in the memory cell array 102 is determined. If they are not the last data to be stored, execution returns to step 200 in FIG. 10A; if they are the last data to be stored, execution proceeds to step 216 in FIG. 10B.

In step 216, whether the programming completion flags of all the data to be stored in the memory cell array 102 are cleared to '0' (indicating completion) is determined. If even one flag is set to '1' (indicating incompletion), execution returns to step 200 in FIG. 10A. If all of the flags are '0', the data writing program ends.

In the programming method described above, the positive voltages (+Vgw) applied to the gate electrode 24 in steps 203 and 209 are preset to values that increase as the read current value of the corresponding data ('00', '01', '10', or '11') decreases. In the first embodiment, the data that require programming are the data '00', '01', '10' other than '11'; the highest voltage value preset as +Vgw is used for programming '00' data. The voltage preset as +Vgw for programming '01' data is lower than the voltage preset as +Vgw for programming '00' data. The voltage preset as +Vgw for programming '10' data is lower than the voltage preset as +Vgw for programming '01' data.

The positive voltages (+Vgw) applied to the gate electrode 24 in steps 203 and 209 are preferably preset to values such that the required number of programming iterations is the same for all charge traps. Since '11' requires no programming in this embodiment, the +Vgw voltage values are preset so that the required number of programming iterations is the same for storing any of the other data '00', '01', and '10'. The number of programming iterations actually performed will then be substantially the same for each charge trap.

The reason why the number of programming iterations actually performed will only be substantially the same is that fabrication process variability leads to structural differences in the memory cells 10, so that even if the values of +Vgw are preset to require the same nominal number of programming iterations for every data value that requires programming, in practice, after all charge traps that require programming in the memory cell array 102 have been programmed the same number of times, some charge traps may produce read currents equal to or less than their verify current value while other charge traps still produce read currents greater than their verify values and require further programming. This situation is not uncommon.

In the first embodiment, in order to use higher programming voltages for data represented by lower read current values, the drain voltage +Vdw is held fixed and the gate voltage +Vgw is varied according to the data, using higher values of +Vgw for data that must produce lower read current values. The reverse scheme is also possible: the gate voltage +Vgw may be held fixed and the drain voltage +Vdw may be varied according to the data. Since the drain voltage has a greater effect than the gate voltage on the amount of charge injected into the charge trap, however, if the drain voltage is varied, accurate adjustment of the preset voltage values becomes more difficult, and as a result, the programming process becomes less accurate. In other words, the method of varying the gate voltage adopted in the first embodiment is able to program the amounts of charge stored in the charge traps more accurately.

The programming voltages may also be increased slightly in each successive programming iteration. That is, in the first embodiment, the +Vgw voltage settings may be increased slightly each time the programming process returns from step 216 in FIG. 10B to, step 200 in FIG. 10A. Although use of the same programming voltages in all programming iterations leads to more accurate programming, some charge traps may require many programming iterations to attain the necessary read current value (the verify current value). Gradually increasing the programming voltage can reduce the number of iterations needed to program these 'stubborn' charge traps.

An exemplary set of programming conditions for the first embodiment is as follows.

In the programming steps 203 in FIG. 10A and 209 in FIG. 10B, the source programming voltage +Vsw is first set to 0 V and the drain programming voltage +Vdw is set to 6.5 V. The substrate potential of the p-well area 14 is 0 V, the same as +Vsw. The gate programming voltage +Vgw is initially set to a value in the range from 9 V to 11 V for '00' data, a value in the range from 6 V to 8 V for '01' data, and a value in the range from 5 V to 7 V for '10' data. The value set for '10' data is less than the value set for '01' data. The programming voltage therefore increases as the read current value of the data decreases. The drain voltage is fixed, while the gate voltage varies between 5 V and 11 V, depending on the data. If the gate voltage were to be fixed and the drain voltage were to be varied, it would become necessary to adjust the drain voltage within a more limited range, such as 5 V to 7 V.

The programming time in each iteration is uniformly 500 nanoseconds, regardless of the data being programmed. In the second programming iteration and each subsequent programming iteration, the +Vgw values are raised by 0.1 V each, up to a maximum limit of 12 V. If the gate voltages were to be held fixed and the drain values were to be varied, smaller increments would become necessary, such as 0.05 V per iteration, for example.

The programming voltages should preferably by set so that a total of about thirty programming iterations suffices to program any charge trap. That is, the total programming time should be within about 15 microseconds.

In the verification steps 204 in FIG. 10A and 210 in FIG. 10B, the source read voltage Vsr is set to 2.0 V, the gate read voltage +Vgr to 3.6 V, and the drain read voltage +Vdr to 0.1 V. The substrate potential of the p-well area 14 is 0 V.

The verify current values in steps 206 and 212 are set in the range from 15 µA to 20 µA for '00' data, 25 µA to 30 µA for '01' data, and 35 µA to 40 µA for '10' data. Preferred values are 15 µA for '00' data, 27 µA for '01' data, and 39 µA for '10' data.

As described, according to the first embodiment, higher voltages are used to program data with lower read current values. All charge traps 30, 32 in which data are to be stored are programmed and verified, in sequence, and flags are set to indicate the charge traps 30, 32 for which the necessary read current values have been attained, i.e., charge traps for which programming has been completed. This procedure is then iterated on the incompletely programmed charge traps 30, 32 until the programming of all charge traps 30, 32 in which data are to be stored has been completed. Use of different programming voltages reduces the differences in the number of programming iterations of different charge traps 30, 32, and thereby reduces deviations of the data from the predetermined read current values. As a result, the current windows necessary for reading four-valued data can be ensured, as shown in FIG. 11.

Figure 11:
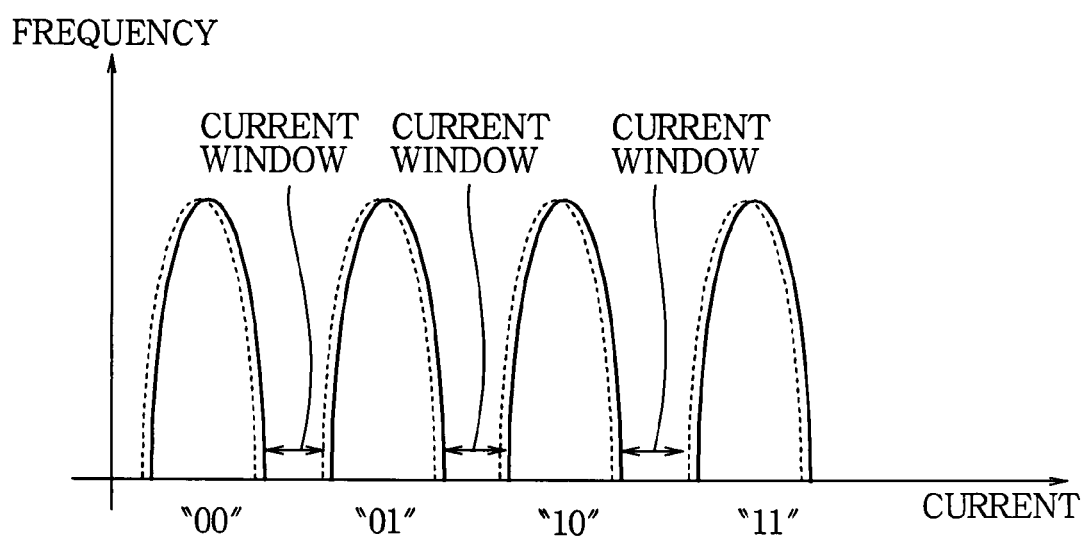
FIG. 11 is a histogram illustrating read current distributions over a large number of memory cells in the first embodiment.

In FIG. 11, the solid lines indicate the distributions of the read current values of data programmed into a memory cell 10 when the mirror charge trap in the same memory cell 10 is not programmed, while the dotted lines indicate the positions to which these distributions shift if the mirror charge trap is also programmed. Because of the small differences in the number of programming iterations, the drop in the read current value of a charge trap caused by programming of the mirror charge trap in the same memory cell 10 is greatly reduced, and adequate current windows are maintained between the read current distributions of all adjacent pairs of data values.

In particular, when the voltages used for programming the first and second charge traps 30, 32 are set so as to equalize the number of programming iterations in the first charge trap 30 and second charge trap 32 in all the memory cells 10 in the memory cell array 102, the difference in the number of programming iterations in the first charge trap 30 and second charge trap 32 can further be reduced. Ideally, the difference in the number of programming iteration can be eliminated in this way.

In the second and subsequent programming iterations in the first and second charge traps 30, 32 according to the embodiment, if the voltage used for programming is increased slightly in each successive iteration, the desired read current values (verify current values) can be achieved efficiently with fewer programming iterations.

A method of writing data in the semiconductor nonvolatile memory 100 according to the first embodiment is above described. The writing method can also be described as follows in terms of one memory cell 10.

When programming is necessary for both charge traps 30, 32 in the memory cell 10, that is, when the data to be stored in both charge traps 30, 32 are '00', '01', or '10', then if the data to be stored in the first charge trap 30 differ from the data to be stored in the second charge trap 32, a higher voltage is used to write the data with the lower read current value. The two charge traps are programmed alternately until one of the charge traps reaches its predetermined verify current value, and then further programming iterations continue on the other charge trap until it also reaches its predetermined verify current value.

Figure 12A:
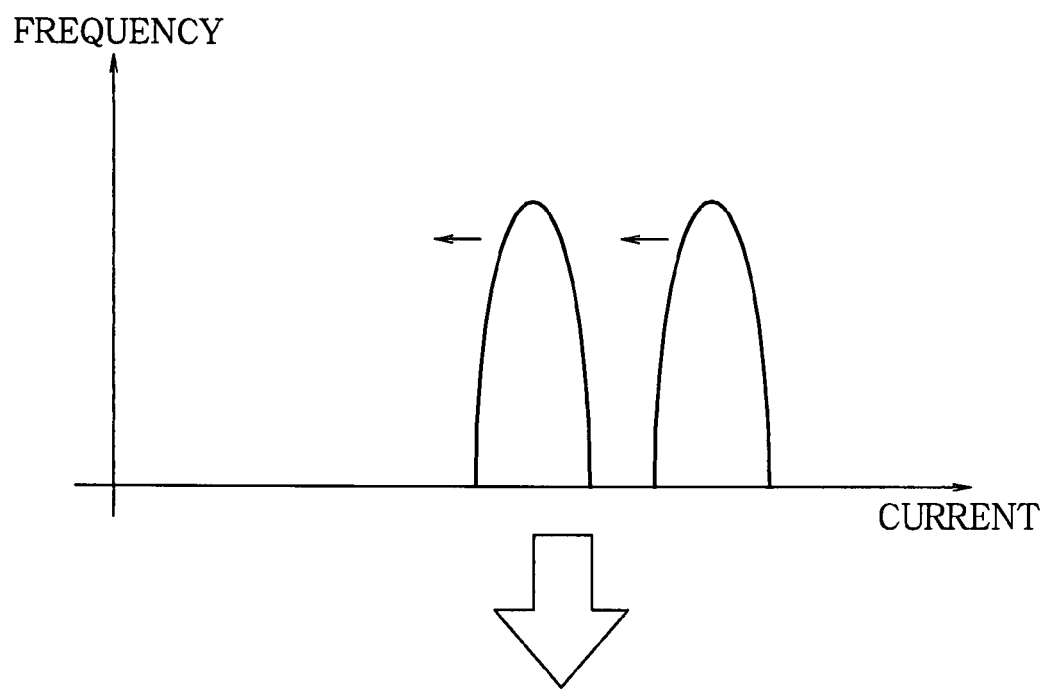
FIG. 12A is a histogram illustrating an intermediate stage in the writing of '01' and '10' data into a large number of memory cells in the first embodiment.
Figure 12B:
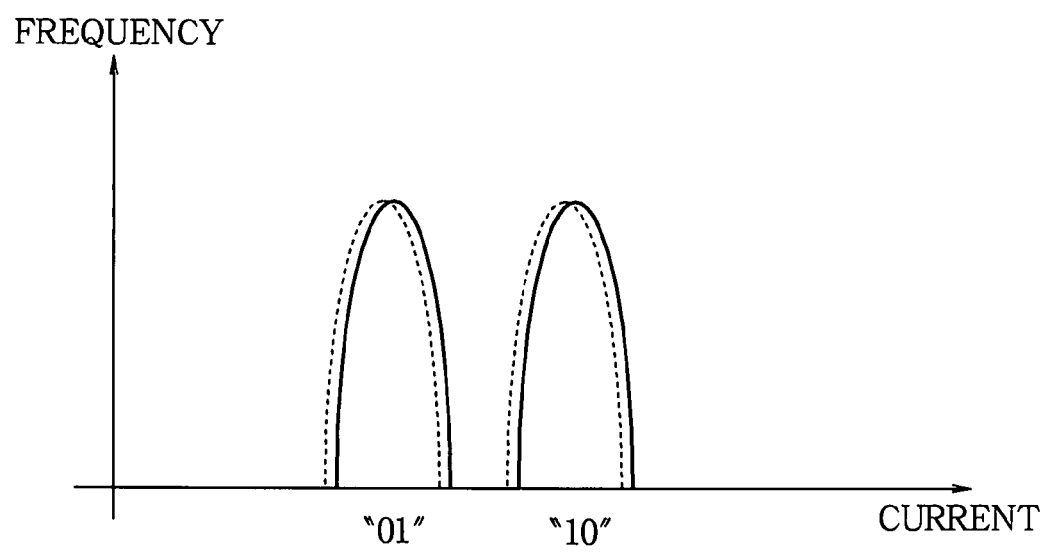
FIG. 12B is a histogram illustrating the final result of the writing of '01' and '10' data into a large number of memory cells in the first embodiment.

For example, FIG. 12A shows distributions of read current values for a plurality of memory cells 10 in which '01' is being programmed into one charge trap and '10' is being programmed into the other charge trap after the two charge traps have been programmed alternately a few times but before the programming is completed. The distributions shift gradually toward the left as indicated by the arrows. FIG. 12B shows the final distributions when the programming of '01' and '10' data in the two charge traps in all of the memory cells 10 has been completed. The solid lines represent the ideal distribution of the read current values that would have been achieved if only one of the charge traps in each memory cell 10 had been programmed; the dotted lines represent the actual distributions of read current values produced by programming both charge traps. Because the voltages used reduce the difference in the number of programming iterations, the programming of both charge traps ends in about the same number of iterations, and neither charge trap suffers a large drop in its read current value due to extensive programming of the mirror charge trap after its own programming has been completed. An adequate current window remains between the dotted curve on the right in FIG. 12B and the solid curve on the left.

In a first variation of the first embodiment, before the data writing program is executed, the charge traps 30, 32 in each memory cell 10 in the memory cell array 102 are erased.

The erasing parameters are a gate voltage −Vge of −6 V, a drain voltage +Vde of 6 V, and a source voltage +Vse of 6 V. These voltages are applied for two milliseconds with the p-well area 14 held at a substrate potential of 0 V.

Figure 13:
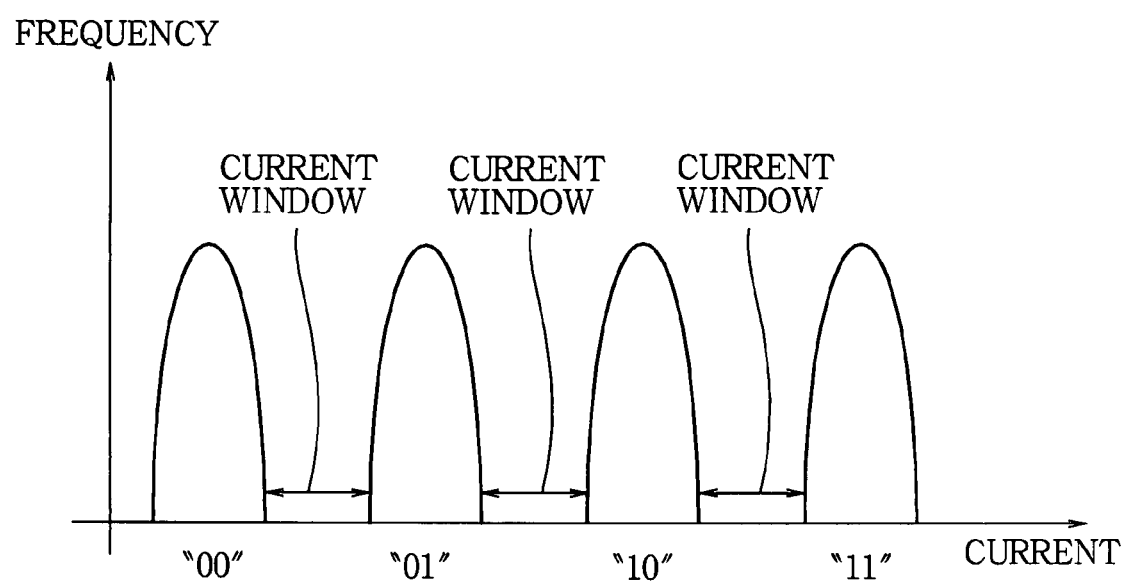
FIG. 13 is a histogram illustrating the distributions of the current values of data written into a large number of memory cells in the first embodiment.

By injecting hot holes into the first and second charge traps 30, 32, this variation of the first embodiment raises the read current value in the initial state (corresponding to '11' data), as shown in FIG. 13. Thus, the current windows between the data can be enlarged.

The data writing program may include an erasing operation as above. In particular, a step may be provided in which data are erased from the first and second charge traps 30, 32 of all the memory cells 10 in the memory cell array 102.

In a second variation of the first embodiment, instead of being raised by 0.1 V in each successive programming iteration, the gate programming voltage Vgw is raised by 0.5 V in the first few programming iterations, then held constant in the further programming iterations. For example, if the gate programming voltage for '00' data is 9 V the first time, it is raised to 9.5 V the second time, to 10 V the third time, and then held constant at 10 V the fourth time and in subsequent iterations.

This variation quickly increases the amount of charge stored per programming iteration. The programming can therefore be completed efficiently with fewer iterations. Although increasing the programming voltage in increments of only 0.1 V yields better programming accuracy, when the number of programming iterations is limited or fast programming is necessary, the second variation of the first embodiment is effective.

Second Embodiment

FIGS. 14A to 14D illustrate a data writing method and program according to a second embodiment of the invention. The memory cell structure and memory device structure are the same as in the first embodiment.

In the second embodiment, all the '00' data (the data with the lowest read current value) are stored first. After this first step, all the '01' and '10' data are written in the same manner as in the first embodiment in a second step.

Next, the operation of the semiconductor nonvolatile memory according to the second embodiment will be described, particularly the operation of the data writing program.

When supplied from an external source with data (four-bit data in the second embodiment) to be stored in one or more memory cells 10 in the memory cell array 102 and address information specifying the addresses of the memory cells 10 in which the data are to be stored, the controller 108 first places the data and address information in its temporary memory 108B, then executes the data writing program stored in its nonvolatile memory 108C as described next with reference to the hardware diagrams in FIGS. 7 and 9 and the flowchart in FIGS. 14A to 14D.

Figure 14A:
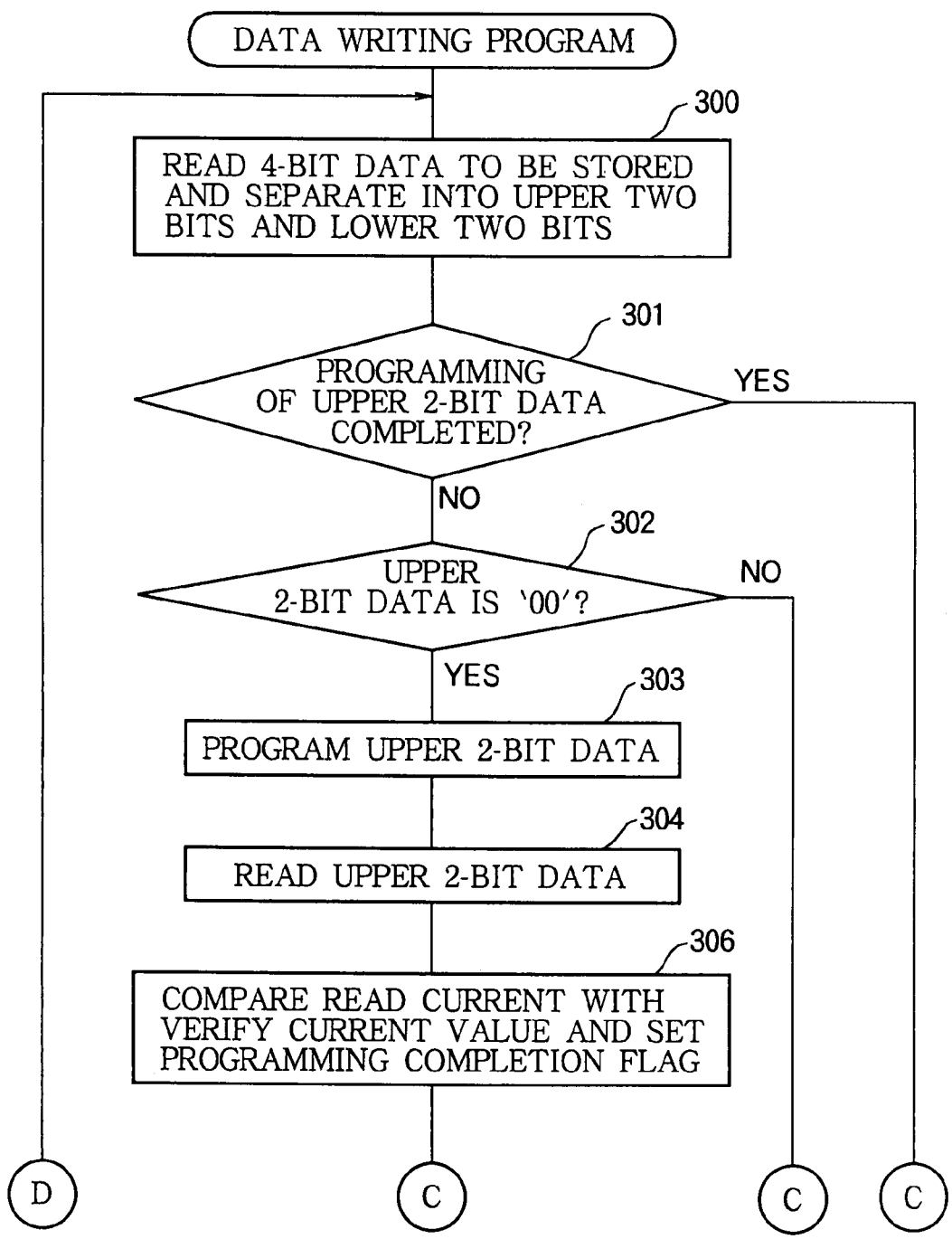
FIGS. 14A to 14D constitute a flowchart illustrating a program for writing data in a semiconductor nonvolatile memory according to a second embodiment of the invention.
Figure 14B:
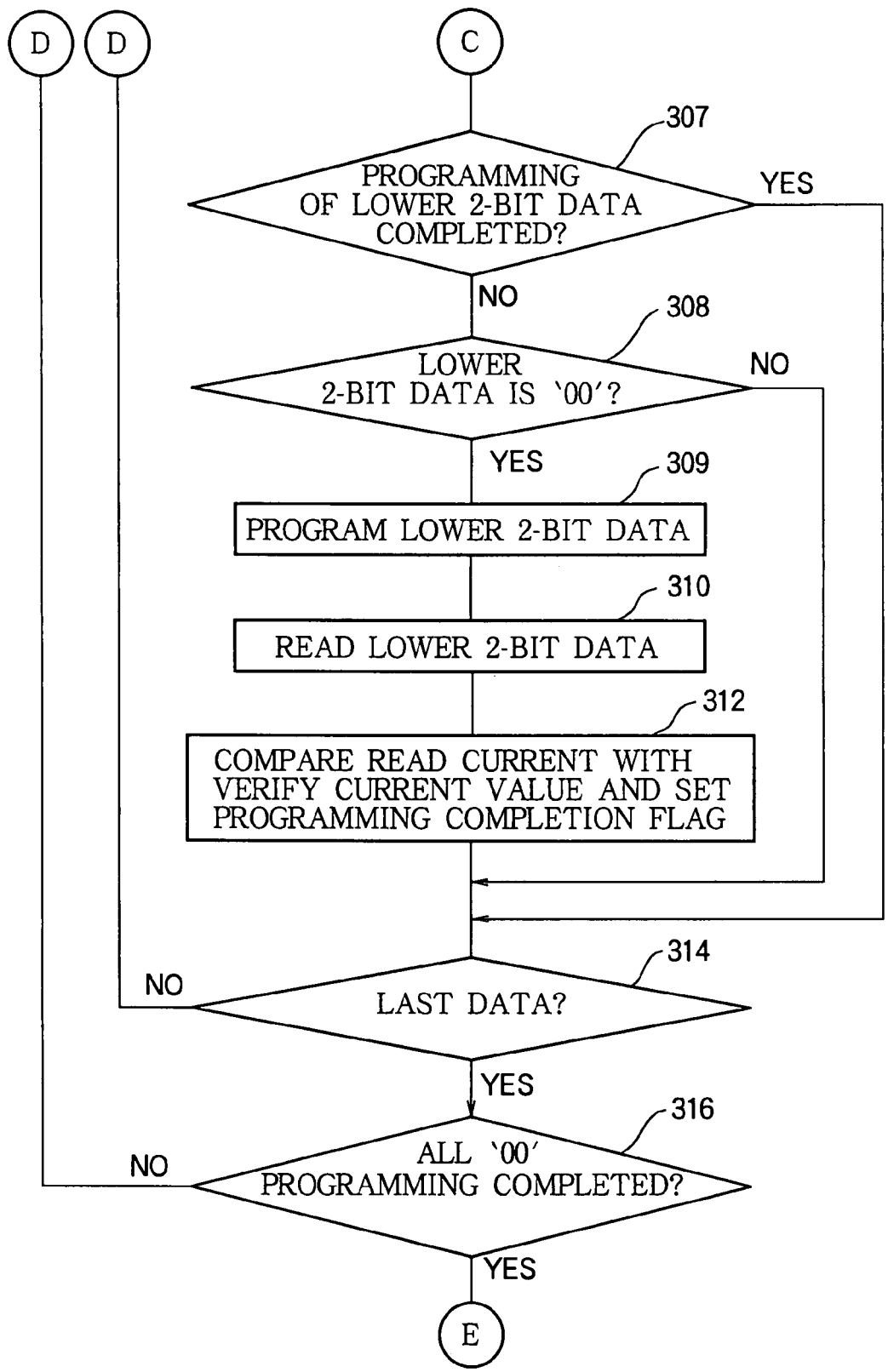

Proceeding sequentially from the first address in the memory cell array 102, in step 300 in FIG. 14A the controller 108 reads the four-bit data to be stored in the addressed memory cell 10 from the temporary memory 108B and separates the four-bit data into an upper two bits and a lower two bits.

In step 301, the programming completion flag for the upper two-bit data is read from the temporary memory 108B to determine whether the writing of the upper two bits of data to be stored into the addressed memory cell 10 has already been completed. If the programming completion flag is set to '1', indicating incompletion, step 302 is executed next; if the programming completion flag is cleared to '0', indicating completion, step 307 is executed next. The programming completion flag is initially set to '1', indicating incompletion. This is also true in the subsequent steps in this embodiment.

In step 302, the upper two bits of data to be stored are tested to determine whether or not they are '00'. If the upper two bits are not '00' (if they are '00', '01', or '10'), no programming is necessary at this time, so step 307 is executed next. If the upper two bits of data are '00', step 303 is executed next.

In step 303, the upper two bits of data ('00' data in this case), a row address indicating the row number of the memory cell 10 in which these data are to be stored, and command information indicating the voltage to be applied to the word line WL are output to the row decoder 104, and a column address indicating the column number of the memory cell 10 in which the data are to be stored and command information indicating the voltage to be applied to the bit line BL connected to the source area 16 are output to the column decoder 106.

The row decoder 104 applies a positive voltage (+Vgw) corresponding to the upper two bits of data for a prescribed programming time to the word line WL with the row number specified by the row address. This positive voltage (+Vgw) will be described later.

The column decoder 106 grounds the bit line BL connected to the drain areas 18 with the column number specified by the column address, and applies a positive voltage (+Vdw) for the prescribed programming time to the bit line BL connected to the corresponding source areas 16.

A positive voltage (+Vdw) is thereby applied to the source area 16 of the specified memory cell 10, and a positive voltage (+Vgw) corresponding to the upper two data bits is applied to the gate electrode 24 of the specified memory cell 10, while the drain area 18 is placed at the ground potential. A certain amount of charge is thereby stored in the first charge trap 30 of the memory cell 10.

In step 304, a row address indicating the row number of the memory cell 10 that was programmed in step 303 and command information indicating a voltage to be applied to the word line WL are output to the row decoder 104, and a column address indicating the column number of the memory cell 10 that was programmed in step 303 and command information indicating a positive or zero voltage to be applied to the bit line BL connected to the source area 16 are output to the column decoder 106.

The row decoder 104 applies a positive voltage (+Vgr) to the word line WL with the row number specified by the row address.

The column decoder 106 applies a positive voltage (+Vsr) to the bit line BL connected to the drain areas 18 with the column number specified by the column address, and applies a positive (+Vdr) or zero voltage to the bit line BL connected to the source area 16.

A positive voltage (+Vdr) or the ground potential is thereby applied to the source area 16 of the specified memory cell 10, a positive voltage (+Vgr) is applied to the gate electrode 24 of the specified memory cell 10, and a positive voltage (+Vsr) is applied to the drain area 18 of the specified memory cell 10, causing current to flow between the drain area 18 and source area 16 of the memory cell 10.

In step 306, the value of this read current is compared with a predetermined verify current value corresponding to the data programmed in step 303 ('00' data in this case). If the read current value is equal to or less than the verify current value, programming of the data into this charge trap is considered to be complete, and '0' (indicating completion) is stored as the programming completion flag together with the address of these data in the temporary memory 108B. If the read current value is greater than the verify current value, programming of the data into this charge trap is considered to be incomplete, and '1' (indicating incompletion) is stored as the programming completion flag together with the address of these data in the temporary memory 108B.

In step 307, the programming completion flag for the lower two-bit data is read from the temporary memory 108B to determine whether the writing of the lower two bits of data to be stored into the addressed memory cell 10 has already been completed. If the programming completion flag is set to '1', indicating incompletion, step 308 is executed next; if the programming completion flag is cleared to '0', indicating completion, step 314 is executed next.

In step 308, the lower two bits of data to be stored are tested to determine whether or not they are '00'. If the lower two bits are not '00' (if they are '01', '10', or '11'), no programming is necessary at this time, so step 314 is executed next. If the lower two bits of data are '00', step 309 is executed next.

In step 309, the lower two bits of data ('00'), a row address indicating the row number of the memory cell 10 in which these data are to be stored, and command information indicating the voltage to be applied to the word line WL are output to the row decoder 104, and a column address indicating the column number of the memory cell 10 in which the data are to be stored and command information indicating the grounding of the bit line BL connected to the source area 16 and driving of the bit line BL connected to the drain area 18 are output to the column decoder 106.

The row decoder 104 applies a positive voltage (+Vgw) corresponding to the lower two bits of data for a prescribed programming time to the word line WL with the row number specified by the row address. This positive voltage (+Vgw) will be described later.

The column decoder 106 applies a positive voltage (+Vdw) for a prescribed programming time to the bit line BL connected to the drain area 18 with the column number specified by the column address, and grounds the bit line BL connected to the source areas 16.

A positive voltage (+Vdw) is thereby applied to the drain area 18 of the specified memory cell 10, and a positive voltage (+Vgw) corresponding to the lower two data bits is applied to the gate electrode 24 of the specified memory cell 10, while the source area 16 is placed at the ground potential. A certain amount of charge is thereby stored in the second charge trap 32 of the memory cell 10.

In step 310, a row address indicating the row number of the memory cell 10 that was programmed in step 309 and command information indicating a voltage to be applied to the word line WL are output to the row decoder 104, and a column address indicating the column number of the memory cell 10 that was programmed in step 309 and command information indicating a voltage to be applied to the word line BL connected to the source area 16 are output to the column decoder 106.

The row decoder 104 applies a positive voltage (+Vgr) to the word line WL with the row number specified by the row address.

The column decoder 106 applies a positive (+Vdr) or zero voltage to the bit line BL connected to the drain areas 18 with the column number specified by the column address, and applies a positive voltage (+Vsr) to the source line SL.

A positive voltage (+Vsr) is thereby applied to the source area 16 of the specified memory cell 10, a positive voltage (+Vgr) is applied to the gate electrode 24 of the specified memory cell 10, and a positive voltage (+Vdr) or ground voltage is applied to the drain area 18 of the specified memory cell 10, causing current to flow between the drain area 18 and source area 16 of the memory cell 10.

In step 312, the value of this read current is compared with a predetermined verify current value corresponding to the data programmed in step 309. If the read current value is equal to or less than the verify current value, programming of the data into this charge trap is considered to be complete, and '0' (indicating completion) is stored as the programming completion flag together with the address of these data in the temporary memory 108B. If the read current value is greater than the verify current value, programming of the data into this charge trap is considered to be incomplete, and '1' (indicating incompletion) is stored as the programming completion flag together with the address of these data in the temporary memory 108B.

In step 314, whether or not the data read in step 300 in FIG. 14A are the last data to be stored in the memory cell array 102 is determined. If they are not the last data to be stored, execution returns to step 300; if they are the last data to be stored, execution proceeds to step 316 in FIG. 14B.

In step 316, whether the programming completion flags for all the '00' data to be stored in the memory cell array 102 are cleared to '0' (indicating completion) is determined. If even one of these flags is set to '1' (indicating incompletion), execution returns to step 300 in FIG. 14A. If all of these flags are '0', step 400 in FIG. 14C is executed next.

In step 400, the controller 108 reads the four-bit data to be stored in the addressed memory cell 10 from the temporary memory 108B sequentially from the first address of the memory cell array 102, and separates the four-bit data into an upper two bits and a lower two bits.

In step 401, the programming completion flag for the upper two-bit data is read from the temporary memory 108B to determine whether the writing of the upper two bits of data to be stored into the addressed memory cell 10 has already been completed. If the programming completion flag is set to '1', indicating incompletion, step 402 is executed next; if the programming completion flag is cleared to '0', indicating completion, step 407 in FIG. 14D is executed next. When the upper two bits of data to be stored are '00' data, the programming has already been completed and the programming completion flag was cleared to '0' in step 306 in FIG. 14A, so step 407 in FIG. 14D will be executed next.

Figure 14C:
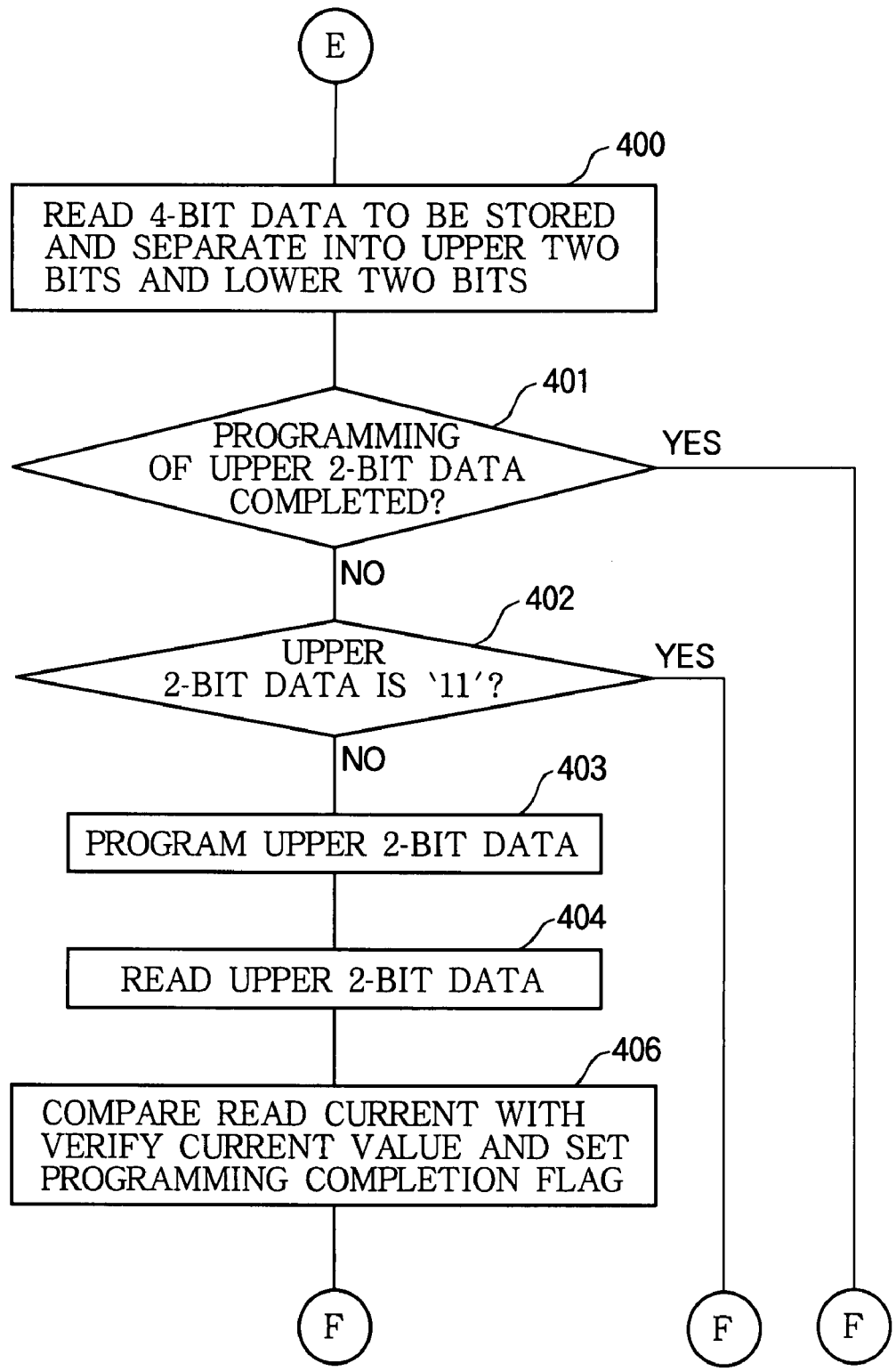
Figure 14D:
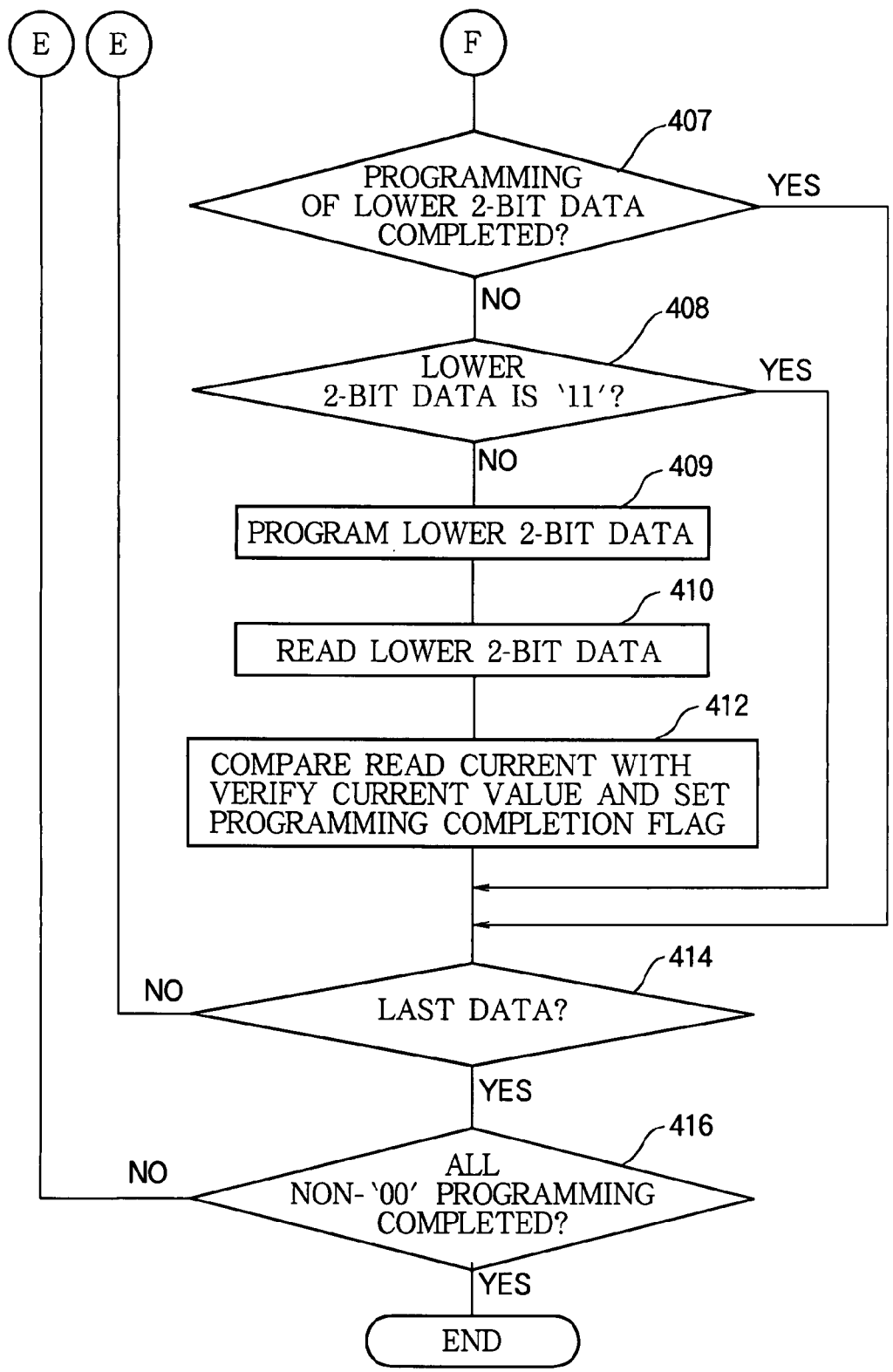

In step 402 in FIG. 14C, the upper two bits of data to be stored are tested to determine whether or not they are '11'. If the upper two bits are '11', no programming is necessary, so '0' (indicating completion) is stored as the programming completion flag together with the address of these data in the temporary memory 108B, and step 407 is executed next. If the upper two bits of data are not '11' (if they are '01' or '10'), step 403 is executed next.

In step 403, the upper two bits of data, a row address indicating the row number of the memory cell 10 in which these data are to be stored, and command information indicating the voltage to be applied to the word line WL are output to the row decoder 104, and a column address indicating the column number of the memory cell 10 in which the data are to be stored and command information indicating the voltage to be applied to the bit line BL connected to the source area 16 are output to the column decoder 106.

The row decoder 104 applies a positive voltage (+Vgw) corresponding to the upper two bits of data for a prescribed programming time to the word line WL with the row number specified by the row address. This positive voltage (+Vgw) will be described later.

The column decoder 106 grounds the bit line BL connected to the drain areas 18 with the column number specified by the column address, and applies a positive voltage (+Vdw) for a prescribed programming time to the bit line BL connected to the source area 16.

A positive voltage (+Vdw) is thereby applied to the source area 16 of the specified memory cell 10, and a positive voltage (+Vgw) corresponding to the upper two data bits is applied to the gate electrode 24 of the specified memory cell 10, while the drain area 18 is placed at the ground potential. A certain amount of charge is thereby stored in the first charge trap 30 of the memory cell 10.

In step 404, a row address indicating the row number of the memory cell 10 that was programmed in step 403 and command information indicating a voltage to be applied to the word line WL are output to the row decoder 104, and a column address indicating the column number of the memory cell 10 that was programmed in step 403 and command information indicating positive or zero voltages to be applied to the bit lines BL connected to the source area 16 and drain area 18 are output to the column decoder 106.

The row decoder 104 applies a positive voltage (+Vgr) to the word line WL with the row number specified by the row address.

The column decoder 106 applies a positive voltage (+Vsr) to the bit line BL connected to the drain areas 18 with the column number specified by the column address, and applies a positive (+Vdr) or zero voltage to the bit line BL connected to the corresponding source areas 16.

A positive voltage (+Vdr) or the ground potential is thereby applied to the source area 16 of the specified memory cell 10, a positive voltage (+Vgr) is applied to the gate electrode 24 of the specified memory cell 10, and a positive voltage (+Vsr) is applied to the drain area 18 of the specified memory cell 10, causing current to flow between the drain area 18 and source area 16 of the memory cell 10.

In step 406, the value of this read current is compared with the predetermined verify current value corresponding to the data programmed in step 403. If the read current value is equal to or less than the verify current value, programming of the data into this charge trap is considered to be complete, and '0' (indicating completion) is stored as the programming completion flag together with the address of these data in the temporary memory 108B. If the read current value is greater than the verify current value, programming of the data into this charge trap is considered to be incomplete, and '1' (indicating incompletion) is stored as the programming completion flag together with the address of these data in the temporary memory 108B.

In step 407, the programming completion flag for the lower two-bit data is read from the temporary memory 108B to determine whether the writing of the lower two bits of data to be stored into the addressed memory cell 10 has already been completed. If the programming completion flag is set to '1', indicating incompletion, step 408 is executed next; if the programming completion flag is cleared to '0', indicating completion, step 414 is executed next. When the lower two bits of data to be stored are '00', the programming has already been completed and the programming completion flag was cleared to '0' in step 312, so step 414 will be executed next.

In step 408, the lower two bits of data to be stored are tested to determine whether or not they are '11'. If the lower two bits are '11', no programming is necessary, so '0' (indicating completion) is stored as the programming completion flag together with the address of these data in the temporary memory 108B, and step 414 is executed next. If the lower two bits of data are not '11' (if they are '01' or '10'), step 409 is executed next.

In step 409, the lower two bits of data, a row address indicating the row number of the memory cell 10 in which these data are to be stored, and command information indicating the voltage to be applied to the word line WL are output to the row decoder 104, and a column address indicating the column number of the memory cell 10 in which the data are to be stored and command information indicating grounding of the bit line BL connected to the source area 16 are output to the column decoder 106.

The row decoder 104 applies a positive voltage (+Vgw) corresponding to the lower two bits of data for a prescribed programming time to the word line WL with the row number specified by the row address. This positive voltage (+Vgw) will be described later.

The column decoder 106 applies a positive voltage (+Vgw) for a prescribed programming time to the bit line BL connected to the drain area 18 with the column number specified by the column address, and grounds the bit line BL connected to the source areas 16.

A positive voltage (+Vdw) is thereby applied to the drain area 18 of the specified memory cell 10, and a positive voltage (+Vgw) corresponding to the lower two data bits is applied to the gate electrode 24 of the specified memory cell 10, while the source area 16 is placed at the ground potential. A certain amount of charge is thereby stored in the second charge trap 32 of the memory cell 10.

In step 410, a row address indicating the row number of the memory cell 10 that was programmed in step 409 and command information indicating a voltage to be applied to the word line WL are output to the row decoder 104, and a column address indicating the column number of the memory cell 10 that was programmed in step 409 and command information indicating a voltage to be applied to the bit line BL connected to the source area 16 are output to the column decoder 106.

The row decoder 104 applies a positive voltage (+Vgr) to the word line WL with the row number specified by the row address.

The column decoder 106 grounds the bit line BL with the column number specified by the column address, and applies a positive voltage (+Vsr) to the bit line BL connected to the source area 16.

A positive voltage (+Vsr) is thereby applied to the source area 16 of the specified memory cell 10, a positive voltage (+Vgr) is applied to the gate electrode 24 of the specified memory cell 10, and a positive voltage (+Vdr) or ground voltage is applied to the drain area 18 of the specified memory cell 10, causing current to flow between the drain area 18 and source area 16 of the memory cell 10.

In step 412, the value of this read current is compared with the predetermined verify current value corresponding to the data programmed in step 409. If the read current value is equal to or less than the verify current value, programming of the data into this charge trap is considered to be complete, and '0' (indicating completion) is stored as the programming completion flag together with the address of these data in the temporary memory 108B. If the read current value is greater than the verify current value, programming of the data into this charge trap is considered to be incomplete, and '1' (indicating incompletion) is stored as the programming completion flag together with the address of these data in the temporary memory 108B.

In step 414, whether the data read in step 400 in FIG. 14C are the last data to be stored in the memory cell array 102 is determined. If they are not the last data to be stored, execution returns to step 400; if they are the last data to be stored, execution proceeds to step 416 in FIG. 14D.

In step 416, whether the programming completion flags for all non-'00' data to be stored in the memory cell array 102 are cleared to '0' (indicating completion) is determined. If even one of these flags is set to '1' (indicating incompletion), execution returns to step 400 in FIG. 14C. If all of these flags are '0', the data writing program ends.

As described above, of the data to be stored, all the '00' data are stored in a first step including all of steps 300 to 316, then all the '01' and '10' data are stored in a second step including all of steps 400 to 416.

In the programming method described above, the voltages for writing data other than '00' data (for writing '01' data and '10' data) are preset to values that increase as the read current value of the corresponding data decreases. The voltage preset as +Vgw for programming '10' data is lower than the voltage preset as +Vgw for programming '01' data.

The positive voltages (+Vgw) are preferably preset to values such that the required number of programming iterations is the same for all charge traps. The +Vgw voltage values are preset so that the required number of programming iterations is the same for storing both '01' and '10' data in steps 400 to 416.

As a result, the number of programming iterations is substantially the same for all the charge traps in which '01' and '10' data are stored. The reason why the number of programming iterations is only 'substantially' the same is that even if the values of +Vgw are preset to make the nominal number of programming iterations identical for all '01' data and '10' data, when the programming is executed according to the data writing program as described, some variation is inevitable, for the reasons described in the first embodiment. Identical numbers of programming iterations are not usually attained in practice.

In the second embodiment, in order to use higher programming voltages for data that produce lower read current values, the drain voltage +Vdr is held fixed and the gate voltage +Vgr is varied according to the data. The reverse scheme is also possible: the gate voltage +Vgr may be held fixed and the drain voltage +Vdr may be varied according to the data. However, the amount of stored charge can be more accurately adjusted by holding the drain voltage fixed and varying the gate voltage, for the reason described in the first embodiment.

The programming voltages may also be increased slightly in each successive programming iteration in the writing of '00' data (steps 300 to 316) and in the writing of '10' data (steps 400 to 416). That is, the +Vgw voltage settings may be increased slightly each time. Although use of the same programming voltages in all programming iterations leads to more accurate programming, some charge traps may require many programming iterations to attain the necessary read current value (the verify current value); programming time can be shortened by increasing the programming voltages in the second and subsequent iterations. 'Second and subsequent iterations' refers to repeated programming of the same memory cell. In the writing of '00' data, second and subsequent iterations are executed when the storing of all '00' data is not completed in step 316 in FIG. 14B and the process returns to step 300 in FIG. 14A for further programming. In the writing of '01' and '10' data, second and subsequent iterations are executed when storing of all non-'00' data is not completed in step 416 in FIG. 14D and the process returns to step 400 in FIG. 14C for further programming.

An exemplary set of programming conditions for the second embodiment is as follows.

In programming steps 303 and 309, +Vdw is set to 6.5 V and +Vsw is set to 0 V. The substrate potential of the p-well area 14 is 0 V, the same as +Vsw. +Vgw is set to a value in the range from 9 V to 11 V: for example, to 9.5 V. The programming time in each iteration is uniformly 500 nanoseconds. In the second programming iteration and each subsequent programming iteration, the +Vgw value is raised by 0.1 V per iteration, up to a maximum limit of 12 V.

In programming steps 403 and 409, +Vdw is set to 6.5 V and Vsw is set to 0 V. The substrate potential of the p-well area 14 is 0 V, the same as +Vsw. +Vgw is a value in the range from 6 V to 8 V for '01' data and a value in the range from 5 V to 7 V for '10' data. The value set for '10' data is less than the value set for '01' data. The programming voltage therefore increases as the read current value of the data decreases. A preferred pair of +Vgw values is 7 V for '01' data and 6.5 V for '10' data.

The programming time in each iteration is uniformly 500 nanoseconds, regardless of the data being programmed. In the second and each subsequent programming iteration, the +Vgw values are raised by 0.1 V each, up to a maximum limit of 12 V. The programming voltages should preferably be set so that a total of about thirty programming iterations suffice to program any charge trap for '01' data and '10' data. That is, the total programming time should be within about 15 microseconds.

In the verification steps 304, 310, 404 and 410, the source read voltage +Vsr is 2.0 V, the gate read voltage +Vgr is 3.6 V, and the drain read voltage Vdw is 0.1 V. The substrate potential of the p-well area 14 is 0 V.

The verify current values in steps 306, 312, 406 and 412 are set in the range from 15 µA to 20 µA for '00' data, 25 µA to 30 µA for '01' data, and 35 µA to 40 µA for '10' data. Preferred values are 15 µA for '00' data, 27 µA for '01' data, and 39 µA for '10' data.

As described above, in accordance with the second embodiment, all the data with the lowest read current value ('00' data) are stored in a first step. Next the other data ('01' and '10' data) that require programming are stored in a second step, using a higher programming voltage for '01' data than for '10' data. In each step, programming is iterated until the all the necessary read current values are obtained. Deviation from the desired read current values of '01' and '10' data is reduced as described in the first embodiment.

After '00' data have been programmed into one charge trap in a memory cell, if other data are programmed into the other charge trap in the same memory cell, the read current value of the '00' data will be lowered, but since '00' data have the lowest read current value, lowering their read current will not reduce any current window. Lowering the '00' read currents can only enlarge the current windows.

Figure 15A:
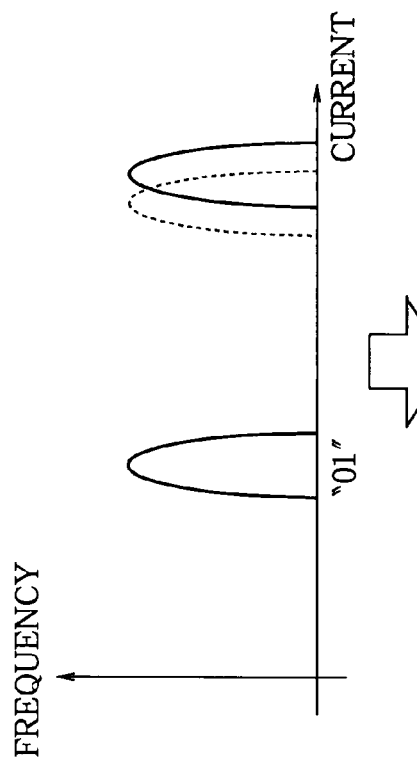
FIGS. 15A and 15B are histograms illustrating the effect of the second embodiment.
Figure 15B:
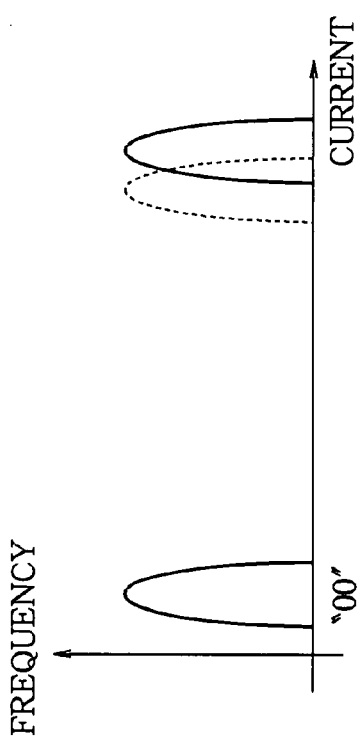

FIGS. 15A and 15B illustrates the result of programming one charge trap in a memory cell to '00', and then programming the other charge trap to '01'. Both graphs show distributions of read currents obtained from many memory cells. In FIG. 15A, the programming of one charge trap to '00' while the mirror charge trap remains in the initial '11' state has pulled down the '11' read current down. In FIG. 15B, the mirror charge trap has been programmed to the '01' level, making the original drop in the '11' read current level irrelevant. The programming of the mirror charge trap has also reduced the read current of the charge trap storing the '00' data, but this serves only to enlarge the current window between the '00' data and the '01' data.

Figure 16A:
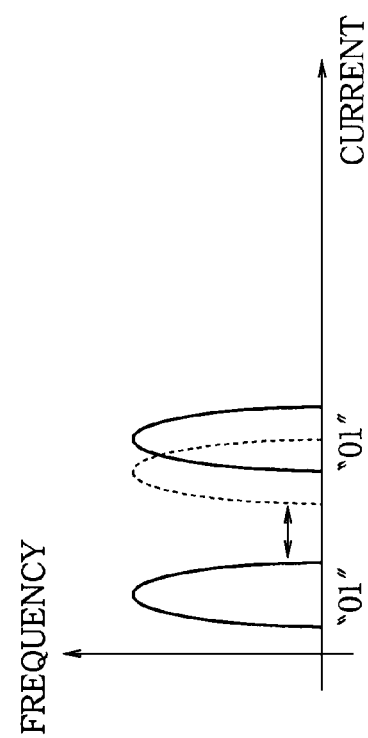
FIGS. 16A and 16B are histograms illustrating the contrasting effect that would be produced by reversing the sequence of steps in the second embodiment.
Figure 16B:
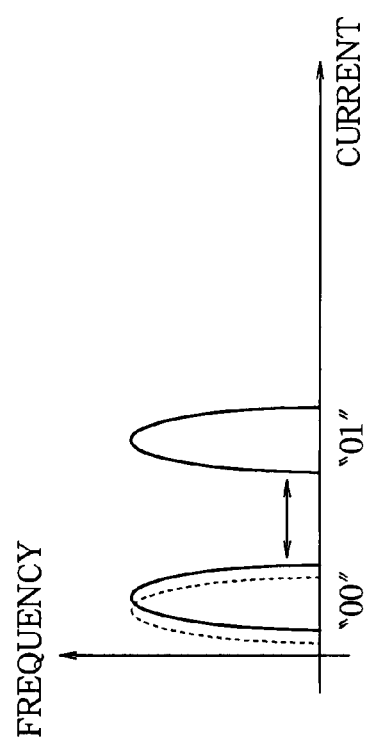

FIGS. 16A and 16B shows the same data stored in the opposite sequence: first the '01' data are stored in FIG. 16A, and then the '00' data are stored in FIG. 16B. As shown in FIG. 16B, programming the '00' data reduces the '01' read current, reducing the current window between the '00' and '01' read current distributions.

In conventional schemes, in which all data are programmed simultaneously with the same programming voltages, the programming of '00' data leads to the greatest narrowing of current windows, since '00' data require the largest number of programming iterations and therefore produce the greatest reduction in the read current values of other data. By programming '00' before other data, the second embodiment ensures that the programming of '00' data will not affect the read current distributions of '01' and '10' data, and simplifies the selection of programming voltages that ensure adequate current windows.

In this embodiment, the gate programming voltages Vgw only have to be selected so as to equalize the number of programming iterations of the data ('01' and '10' data) that are programmed simultaneously; the number of programming iterations required for the data with lowest read current value ('00' data), which are programmed before the other data, is not an issue. Therefore, selection of appropriate Vgw values is easier than in the first embodiment, in which the Vgw values must be selected to produce the same number of programming iterations for all data to be stored ('00', '01', and '10' data), including the data with the lowest read current value. As a result, the second embodiment can equalize the number of programming iterations of '01' and '10' data more accurately than is possible in the first embodiment.

In a first variation of the second embodiment, before the data writing program is executed, the charge traps 30, 32 in each memory cell 10 in the memory cell array 102 are erased. This variation is the same as the first variation of the first embodiment, so a detailed description will be omitted.

In a second variation of the second embodiment, the programming voltage is raised rapidly and then held constant, as in the second variation of the first embodiment. For example, the programming voltage may be raised by 0.5 V per iteration for a predetermined number of iterations and then held constant, thereby increasing the number of iterations that are carried out with relatively high programming voltages. This variation can be applied in steps 300 to 316, in steps 400 to 416, or in both steps 300 to 316 and steps 400 to 416. The details are same as in the second variation of the first embodiment, so further description will be omitted.

The invention is not limited to two charge traps 30, 32 per memory cell 10, as in the first and second embodiments. There may be three or more charge traps per memory cell 10.

The invention is not limited to storing four-valued (two-bit) data in each charge trap as in the first and second embodiments. In general, N-valued data may be stored in each charge trap, where N is three or any larger integer.

In the first and second embodiments, the storage of data with the highest read current value ('11' data) required no programming; the initial state was used without change. The invention is also applicable, however, to memories in which all stored data are programmed away form the initial state, including the data with the highest read current value. For example, the second embodiment can be applied to a memory in which each charge trap stores three-valued data: all data with lowest read current value are programmed in a first step, and then the data with the other two values are programmed in a second step.

In the first and second embodiments, the controller 108 is integrated into the semiconductor nonvolatile memory 100, but the invention can also be practiced when, for example, the controller 108 is replaced by an external controller or programming device that controls the row decoder 104 and column decoder 106 to store data in the charge traps.

The write operations described in the first and second embodiments proceed by first storing four bits of data in the temporary memory 108B for each memory cell, then separating the four-bit data into an upper two bits and a lower two bits, and finally writing each two bits of data into a separate charge trap, but the data may be originally received as two-bit data by the temporary memory 108B and then written as received into the charge traps.

Those skilled in the art will recognize that further variations are possible within the scope of the invention, which is defined in the appended claims.

What is claimed is:

1. A method of storing data in a memory cell having a first charge trap and a second charge trap, each of the first and second charge traps being operable to store data with at least three possible values, the method comprising the steps of:
   (a) programming the first charge trap by using a first programming voltage;
   (b) reading the first charge trap to obtain a first read current and deciding whether the first read current has been reduced to or below a first value, corresponding to data to be stored in the first charge trap;
   (c) programming the second charge trap by using a second programming voltage lower than the first programming voltage;
   (d) reading the second charge trap to obtain a second read current and deciding whether the second read current has been reduced to or below a second value, corresponding to data to be stored in the second charge trap, the second value being higher than the first value;
   (e) repeating said steps (a), (b), (c), and (d) until an affirmative decision is obtained in at least one of said steps (b) and (d);
   (f) if an affirmative decision is obtained in said step (b) while a negative decision is still obtained in said step (d), repeating said steps (c) and (d) until an affirmative decision is obtained in said step (d); and
   (g) if an affirmative decision is obtained in said step (d) while a negative decision is still obtained in said step (b), repeating said steps (a) and (b) until an affirmative decision is obtained in said step (b).

2. The method of claim 1, further comprising selecting the first programming voltage and the second programming so that affirmative decisions are obtained in said steps (b) and (d) in substantially equal numbers of repetitions of said steps (a) and (c).

3. The method of claim 1, wherein the memory cell has a gate electrode, and the first programming voltage and the second programming voltage are applied to the gate electrode.

4. The method of claim 1, further comprising erasing the first charge trap and the second charge trap before said step (a).

5. The method of claim 1, further comprising increasing the first programming voltage and the second programming voltage at successive repetitions of said steps (a), (b), (c), and (d).

6. The method of claim 5, wherein the first programming voltage and the second programming voltage are increased in constant increments up to a predetermined voltage, and then held constant.

7. The method of claim 5, wherein the first programming voltage and the second programming voltage are increased a predetermined number of times, and then held constant.

8. The method of claim 1, wherein the at least three possible values of the data storable in each of the first and second charge traps include a value represented by a read current obtained in an erased state.

9. The method of claim 1, wherein the at least three possible values of the data storable in each of the first and second charge traps are represented by different read currents all lower than a read current obtained in an erased state.

10. A method of storing data in a semiconductor nonvolatile memory having a memory cell array provided with a plurality of memory cells, each memory cell having a plurality of charge traps, each charge trap being operable to store data with at least three possible values, the method comprising the steps of:
  (a) programming all of the charge traps that are to store data requiring programming and have not yet been flagged as completed, using different programming voltages for data represented by different read current values, successively higher programming voltages being used for data represented by successively lower read current values;
  (b) reading the charge traps programmed in said step (a) and flagging each charge trap as completed if its read current is equal to or less than the read current value representing the data to be stored in the charge trap; and
  (c) repeating said steps (a) and (b) until all of the charge traps that are to store data requiring programming have been flagged as completed.

11. A semiconductor nonvolatile memory having a memory cell array provided with a plurality of memory cells, each memory cell having a plurality of charge traps, each charge trap being operable to store data with at least three possible values, the semiconductor nonvolatile memory comprising:
  a controller for storing data in the memory cell array by the method of claim 10; and
  a voltage supplying unit for supplying said different programming voltages to the memory cell array under control of the controller.

12. The semiconductor nonvolatile memory of claim 11, wherein each memory cell comprises:
  a semiconductor substrate;
  a gate insulation film formed on the semiconductor substrate;
  a gate electrode formed on the gate insulation film, the gate electrode having a first side and a second side;
  a first charge trap formed on the first side of the gate electrode; and
  a second charge trap formed on the second side of the gate electrode, physically discontinuous from the first charge trap.

13. A method of manufacturing a semiconductor nonvolatile memory having a memory cell array provided with a plurality of memory cells, each memory cell having a plurality of charge traps, each charge trap being operable to store data with at least three possible values, the semiconductor nonvolatile memory, the method comprising storing data in the memory cell array by the method of claim 11.

14. A machine-readable medium storing instructions executable by a computing device to store data in a semiconductor nonvolatile memory by the method of claim 10.

15. A method of storing data in a semiconductor nonvolatile memory having a memory cell array provided with a plurality of memory cells, each memory cell having a plurality of charge traps, each charge trap being operable to store data with at least three possible values, different data values being represented by different read current values including a lowest current value and at least two higher current values requiring programming, the method comprising the steps of:
  (a) programming all of the charge traps that are to store data represented by the lowest read current value and have not yet been flagged as completed;
  (b) reading all of the charge traps programmed in said step (a) and flagging each charge trap as completed if its read current is equal to or less than the lowest read current value;
  (c) repeating said steps (a) and (b) until all of the charge traps that are to store data represented by the lowest read current value have been flagged as completed;
  (d) programming all of the charge traps that are to store data represented by the higher current values requiring programming and have not yet been flagged as completed, using different programming voltages for data represented by different read current values, successively higher programming voltages being used for data represented by successively lower read current values;
  (e) reading the charge traps programmed in said step (d) and flagging each charge trap as completed if its read current is equal to or less than the read current value representing the data to be stored in the charge trap; and
  (f) repeating said steps (d) and (e) until all of the charge traps that are to store data requiring programming and have been flagged as completed.

16. A semiconductor nonvolatile memory having a memory cell array provided with a plurality of memory cells, each memory cell having a plurality of charge traps, each charge trap being operable to store data with at least three possible values, the semiconductor nonvolatile memory comprising:
  a controller for storing data in the memory cell array by the method of claim 15; and
  a voltage supplying unit for supplying said different programming voltages to the memory cell array under control of the controller.

17. The semiconductor nonvolatile memory of claim 16, wherein each memory cell comprises:
  a semiconductor substrate;
  a gate insulation film formed on the semiconductor substrate;
  a gate electrode formed on the gate insulation film, the gate electrode having a first side and a second side;
  a first charge trap formed on the first side of the gate electrode; and
  a second charge trap formed on the second side of the gate electrode, physically discontinuous from the first charge trap.

18. A method of manufacturing a semiconductor nonvolatile memory having a memory cell array provided with a plurality of memory cells, each memory cell having a plurality of charge traps, each charge trap being operable to store data with at least three possible values, the semiconductor nonvolatile memory, the method comprising storing data in the memory cell array by the method of claim 15.

19. A machine-readable medium storing instructions executable by a computing device to store data in a semiconductor nonvolatile memory by the method of claim 15.

* * * * *